United States Patent
Kumar et al.

(10) Patent No.: US 9,336,876 B1
(45) Date of Patent: May 10, 2016

(54) SOAK TIME PROGRAMMING FOR TWO-TERMINAL MEMORY

(71) Applicant: Crossbar, Inc., Santa Clara, CA (US)

(72) Inventors: Tanmay Kumar, Pleasanton, CA (US); Layne Armijo, Los Gatos, CA (US); Sung Hyun Jo, Sunnyvale, CA (US)

(73) Assignee: Crossbar, Inc., Santa Clara, CA (US)

( * ) Notice: Subject to any disclaimer, the term of this patent is extended or adjusted under 35 U.S.C. 154(b) by 0 days.

(21) Appl. No.: 14/214,108

(22) Filed: Mar. 14, 2014

Related U.S. Application Data

(60) Provisional application No. 61/792,593, filed on Mar. 15, 2013.

(51) Int. Cl.
*G11C 11/00* (2006.01)
*G11C 13/00* (2006.01)

(52) U.S. Cl.
CPC ........ *G11C 13/0069* (2013.01); *G11C 13/0004* (2013.01); *G11C 13/0007* (2013.01); *G11C 2013/0078* (2013.01)

(58) Field of Classification Search
CPC ........... G11C 13/0004; G11C 13/0007; G11C 13/0069
USPC ................................................. 365/148, 163
See application file for complete search history.

(56) References Cited

U.S. PATENT DOCUMENTS

| | | | | |
|---|---|---|---|---|
| 7,126,846 | B2 * | 10/2006 | Ha et al. | 365/163 |
| 7,660,147 | B2 * | 2/2010 | Chao et al. | 365/148 |
| 7,787,291 | B2 * | 8/2010 | Resta et al. | 365/163 |
| 7,929,336 | B2 * | 4/2011 | Philipp et al. | 365/163 |
| 7,978,508 | B2 * | 7/2011 | Czubatyj | 365/163 |
| 8,787,095 | B2 * | 7/2014 | Chen | 365/189.011 |
| 2009/0040813 | A1 * | 2/2009 | Kang et al. | 365/163 |
| 2010/0226168 | A1 * | 9/2010 | Savransky | 365/163 |

* cited by examiner

*Primary Examiner* — Son Mai
(74) *Attorney, Agent, or Firm* — Amin, Turocy & Watson, LLP

(57) ABSTRACT

Providing for improved programming techniques for endurance and memory retention in two-terminal memory is described herein. In some embodiments, a programming pulse can be configured to provide a minimum pulse time over which a program signal is applied to a two-terminal memory cell, following programming of the two-terminal memory cell. This minimum pulse time can help to stabilize the program state of the two-terminal memory cell, improving stability of the program state (e.g., related to memory retention) and overall increased endurance (e.g., in program cycles) of the two-terminal memory cell. The minimum pulse time can be initiated separately to a programming pulse, or can be integrated as part of the program pulse, in various embodiments. In some embodiments, current compliance or voltage control can be implemented in conjunction with providing programming and minimum pulse time functionality.

21 Claims, 12 Drawing Sheets

SOAK TIME PROGRAMMING FOR TWO-TERMINAL MEMORY

CROSS-REFERENCE TO RELATED APPLICATION

The present application for patent claims the benefit of U.S. Provisional Patent Application Ser. No. 61/792,593 and filed Mar. 15, 2013, incorporated herein by reference in its entirety and for all purposes.

TECHNICAL FIELD

This disclosure relates generally to electronic memory; for example, the disclosure describes the pre-conditioning of two-terminal memory to improve endurance and switching functionality of a two-terminal memory cell.

BACKGROUND

Success of semiconductor electronics has largely resulted from a great personal and commercial utility derived from high-speed electronic communications. Provision of these electronic communications, particularly on a global scale, involves the convergence of several factors: development of communication infrastructure to transport data, design of components and devices to initiate or facilitate communication and various applications thereof, and manufacturing techniques to fabricate these components. Massive demand for the utility of electronic communication has engendered an industry related to each of the factors. Infrastructure developers provide global networks to transport data and interpersonal communications, software developers provide applications, operating systems, and computing devices to access, manage and utilize the communications, component designers develop electronic components—processors, memory, etc.—to process and store the data, and fabrication facilities create the electronic components.

One reason for the persistent success of electronics is the variety and diversity of useful applications that develop from increases in speed and capacity of electronic components. In turn, the speed and capacity of such components is associated with an intensive transistor down-scaling process, in which smaller transistors have lead to increased storage capacity, and in some cases increased processing power. In recent years, components such as field effect transistors used for switches, memory cells, and other components of electronic devices have achieved sizes on the order of 20 nm. Even smaller such devices are theorized. The inventors of the present disclosure, however, believe that significant challenges will occur for sub-20 nm transistor components, including short channel effects, performance degradation, longevity problems, and so on.

Resistive memory devices represent a recent innovation within the field of integrated circuit technology. While much of this technology is in the development stages, various technological concepts for proposed resistive memory devices and fabrication of the same have been demonstrated by the inventors. The inventors believe that various resistive memory technologies and various techniques for fabricating various resistive memory devices show compelling evidence to hold substantial advantages over competing technologies in the semiconductor electronics industry.

Over time, advancement in technology has provided an increase in a number of semiconductor devices, such as transistors, that can be fabricated on a given geometric area of a semiconductor chip. An implication of increasing the number of semiconductor devices is increasing memory capacity and processing power for the semiconductor chip and associated electronic devices.

In light of the above, the inventors desire to continue developing practical utilization and fabrication of resistive memory technology.

SUMMARY

The following presents a simplified summary of the specification in order to provide a basic understanding of some aspects of the specification. This summary is not an extensive overview of the specification. It is intended to neither identify key or critical elements of the specification nor delineate the scope of any particular embodiments of the specification, or any scope of the claims. Its purpose is to present some concepts of the specification in a simplified form as a prelude to the more detailed description that is presented in this disclosure.

Various embodiments of the subject disclosure provide for improved programming techniques for two-terminal memory. In some embodiments, a programming pulse can be configured to provide a minimum pulse time over which a program signal is applied to a two-terminal memory cell, following programming of the two-terminal memory cell. This minimum pulse time can help to stabilize the program state of the two-terminal memory cell, improving stability of the program state (e.g., related to memory retention) and overall increased endurance (e.g., in program cycles) of the two-terminal memory cell.

In some disclosed embodiments, programming a two-terminal memory cell can comprise a multi-cycle programming signal. A first stage of the programming signal can comprise a forming pulse configured to cause the two-terminal memory cell to change state from a non-program state to a program state. A second state of the programming signal can comprise a follow-up pulse—also referred to as a soak pulse—that applies an electric signal to the two-terminal memory cell in the program state for a minimum duration equal to the pulse width of the follow-up pulse. Experiencing the electric signal while in the program state can serve to stabilize the program state of the two-terminal memory cell, and improve long-term memory endurance. In at least one embodiment, current compliance can be employed in conjunction with the forming pulse or the follow-up pulse, to enforce an upper current limit at the two-terminal memory cell. In other embodiments, a voltage terminator circuit can be employed to limit voltage at the two-terminal memory cell to a predetermined voltage value.

In still other embodiments, programming a two-terminal memory cell can comprise a program pulse comprising multiple stages. A first stage can comprise a program signal configured to cause the two-terminal memory cell to change to a program state. In addition, the change to the program state can trigger a second stage of the program pulse, having a minimum second stage pulse width. This second stage is applied to the two-terminal memory cell in the program state for a duration equal to the minimum second stage pulse width. In some embodiments, current compliance can be employed for the first stage of the program signal, and activation of the current compliance can be used as the trigger for the second stage of the program pulse. In this manner, the program signal can apply a first stage suitable for programming the two-terminal memory cell, and apply a second stage suitable for stabilizing the program state of the two-terminal memory cell automatically in response to the change to the program state.

In further embodiments, the subject disclosure provides a method of programming a two-terminal memory cell. The method can comprise applying a forming signal to the two-terminal memory cell, the forming signal having a magnitude configured to cause a state change in the two-terminal memory cell to a program state. Furthermore, the method can comprise applying a follow-up signal to the two-terminal memory cell in the program state, the follow-up signal having a predetermined minimum pulse width.

In one or more additional embodiments, the subject disclosure can provide an electronic device comprising a memory configured to store instructions related to operating the electronic device, the memory comprising an array of memory cells including a two-terminal memory cell and a memory controller configured to operate the memory. Moreover, the electronic device can comprise a processor communicatively connected to the memory and configured to execute the instructions to facilitate implementing operations of the electronic device. According to various embodiments, the memory controller can be configured to apply a forming signal to the two-terminal memory cell that is configured to cause the two-terminal memory cell to switch to a program state. In addition, the memory controller can be configured to apply a follow-up signal to the two-terminal memory cell following the two-terminal terminal memory cell switching to the program state, the follow-up signal having a pulse width equal to or greater than 10 nanoseconds.

The following description and the drawings set forth certain illustrative aspects of the specification. These aspects are indicative, however, of but a few of the various ways in which the principles of the specification may be employed. Other advantages and novel features of the specification will become apparent from the following detailed description of the specification when considered in conjunction with the drawings.

BRIEF DESCRIPTION OF THE DRAWINGS

Numerous aspects, embodiments, objects, and advantages of the instant invention will be apparent upon consideration of the following detailed description, taken in conjunction with the accompanying drawings, in which like reference characters refer to like parts throughout. In this specification, numerous specific details are set forth in order to provide a thorough understanding of this disclosure. It should be understood, however, that certain aspects of the subject disclosure may be practiced without these specific details, or with other methods, components, materials, etc. In other instances, well-known structures and devices are shown in block diagram form to facilitate describing the subject disclosure.

DETAILED DESCRIPTION

Figure 1:
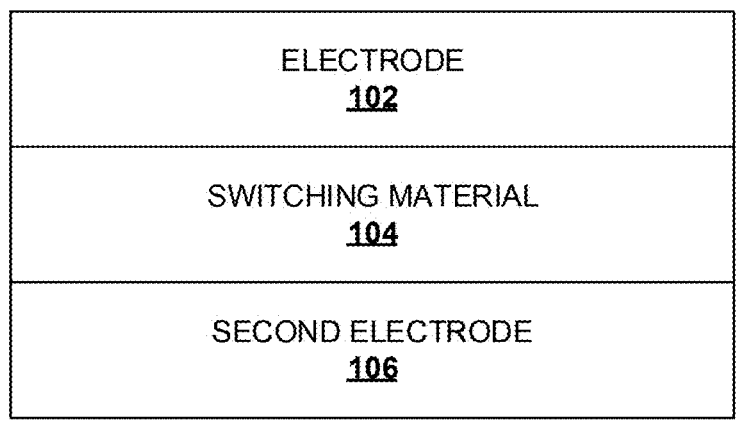
FIG. 1 depicts a block diagram of an example two-terminal memory according to various embodiments of the present disclosure.

This disclosure relates to two-terminal memory cells employed for digital information storage. In some embodiments, the two-terminal memory cells can include a resistive technology, such as a resistive-switching two-terminal memory cell. Resistive-switching two-terminal memory cells (also referred to as resistive-switching memory cells or resistive-switching memory), as utilized herein, comprise circuit components having conductive contacts with an active region between the two conductive contacts. The active region of the two-terminal memory device, in the context of resistive-switching memory, exhibits a plurality of stable or semi-stable resistive states, each resistive state having a distinct electrical resistance. Moreover, respective ones of the plurality of states can be formed or activated in response to a suitable electrical signal applied at the two conductive contacts. The suitable electrical signal can be a voltage value, a current value, a voltage or current polarity, or the like, or a suitable combination thereof. An example of a resistive switching two-terminal memory device, though not exhaustive, can include a resistive random access memory (RRAM).

The inventors of the subject application are familiar with additional non-volatile, two-terminal memory structures. For example, ferroelectric random access memory (RAM) is one example. Some others include magneto-resistive RAM, organic RAM, phase change RAM and conductive bridging RAM, and so on. Two-terminal memory technologies have differing advantages and disadvantages, and trade-offs between advantages and disadvantages are common. For instance, various subsets of these devices can have relatively fast switching times, good durability, high memory density, low cost fabrication, long life, or the like, or combinations thereof. Meanwhile, the various subsets can also be difficult to fabricate, have compatibility problems with many common CMOS fabrication processes, poor read performance, small on/off resistance ratios, small on/off resistance ratios (e.g., leading to small sensing margin) or poor thermal stability, as well as other problems. Though resistive-switching memory technology is considered by the inventors to be one of the best technologies having the most benefits and least detriments, other two-terminal memory technologies can be utilized for some of the disclosed embodiments, where suitable to one of ordinary skill in the art.

Embodiments of the subject disclosure can provide a filamentary-based memory cell. One example of a filamentary-based memory cell can comprise: a p-type or n-type silicon (Si) bearing layer (e.g., p-type or n-type polysilicon, p-type or n-type SiGe, etc.), a resistive switching layer (RSL) and an active metal layer capable of being ionized or generating ions (e.g., at a boundary of the RSL and the active metal layer). Under suitable conditions, the active metal layer can provide filament forming ions to the RSL. The p-type or n-type Si bearing layer can include a p-type or n-type polysilicon, p-type or n-type SiGe, or the like. The RSL (which can also be referred to in the art as a resistive switching media (RSM)) can comprise, e.g., an undoped amorphous Si layer, a semiconductor layer having intrinsic characteristics, a Si sub-oxide (e.g., SiOx wherein x has a value between 0.1 and 2), metallic oxide (e.g. Zinc Oxide) and so forth. Other examples of materials suitable for the RSL could include $Si_XGe_YO_Z$ (where X, Y and Z are respective suitable positive integers), a silicon oxide (e.g., $SiO_N$, where N is a suitable positive integer), amorphous Si (a-Si), amorphous SiGe (a-SiGe), $TaO_B$ (where B is a suitable positive integer), $HfO_C$ (where C is a suitable positive integer), $TiO_D$ (where D is a suitable positive integer), and so forth, or a suitable combination thereof. Examples of the active metal layer can include, among others: silver (Ag), gold (Au), titanium (Ti), titanium-nitride (TiN) or other suitable compounds of titanium, nickel (Ni), copper (Cu), aluminum (Al), chromium (Cr), tantalum (Ta), iron (Fe), manganese (Mn), tungsten (W), vanadium (V), cobalt (Co), platinum (Pt), and palladium (Pd). Other suitable conductive materials, as well as compounds or combinations of the foregoing or similar materials can be employed for the active metal layer in some aspects of the subject disclosure. Some details pertaining to embodiments of the subject disclosure similar to the foregoing example(s) can be found in the following U.S. patent applications that are licensed to the assignee of the present application for patent: application Ser. No. 11/875,541 filed Oct. 19, 2007 and application Ser. No. 12/575,921 filed Oct. 8, 2009, in U.S. patent application Ser. No. 13/761,132 filed Feb. 6, 2013 and assigned to the assignee of the present application for patent, and in U.S. Pat. No. 8,198,144 issued Jun. 12, 2012 and assigned to the assignee of the present application for patent, each of which are incorporated by reference herein in their respective entireties and for all purposes.

To program a filamentary-based resistive switching memory cell, a suitable program voltage can be applied across the memory cell causing a conductive path or a filament to form through a relatively high resistive portion of the memory cell. This causes the memory cell to switch from a relatively high resistive state, to a relatively low resistive state. In some resistive-switching devices, an erase process can be implemented to deform the conductive filament, at least in part, causing the memory cell to return to the high resistive state from the low resistive state. This change of state, in the context of memory, can be associated with respective states of a binary bit. For an array of multiple memory cells, a word(s), byte(s), page(s), block(s), etc., of memory cells can be programmed or erased to represent zeroes or ones of binary information, and by retaining those states over time in effect storing the binary information In various embodiments, multi-level information (e.g., multiple bits) may be stored in such memory cells.

It should be appreciated that various embodiments herein may utilize a variety of memory cell technologies, having different physical properties. For instance, different resistive-switching memory cell technologies can have different discrete programmable resistances, different associated program/erase voltages, as well as other differentiating characteristics. For instance, various embodiments of the subject disclosure can employ a bipolar switching device that exhibits a first switching response (e.g., programming to one of a set of program states) to an electrical signal of a first polarity and a second switching response (e.g., erasing to an erase state) to the electrical signal having a second polarity. The bipolar switching device is contrasted, for instance, with a unipolar device that exhibits both the first switching response (e.g., programming) and the second switching response (e.g., erasing via joule heating) in response to electrical signals having the same polarity and different magnitudes.

Where no specific memory cell technology or program/erase voltage is specified for the various aspects and embodiments herein, it is intended that such aspects and embodiments incorporate any suitable memory cell technology and be operated by program/erase voltages appropriate to that technology, as would be known by one of ordinary skill in the art or made known by way of the context provided herein. It should be appreciated further that where substituting a different memory cell technology would require circuit modifications that would be known to one of ordinary skill in the art, or changes to operating signal levels that would be known to one of such skill, embodiments comprising the substituted memory cell technology(ies) or signal level changes are considered within the scope of the subject disclosure.

Figure 2:
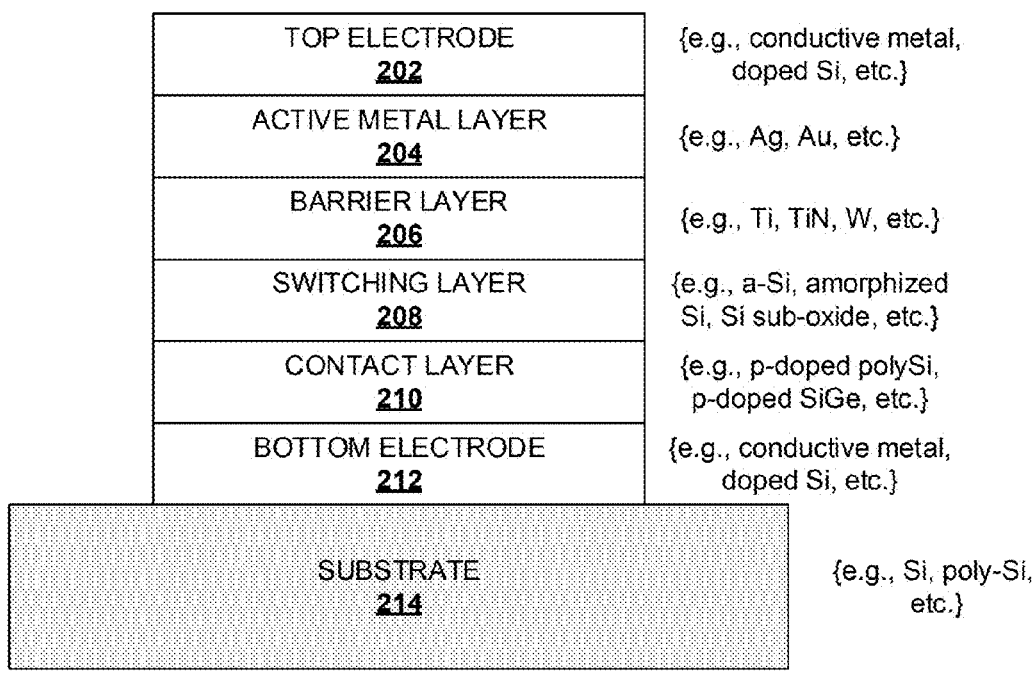
FIG. 2 illustrates a block diagram of an alternative example two-terminal memory cell according to further embodiments.

Referring now to the drawings, FIGS. 1 and 2 illustrate respective block diagrams of example memory stacks 100 and 200. Memory stack 100 and memory stack 200 can be two-terminal memory devices, in various embodiments, such as resistive-switching memory. It should be appreciated that other two-terminal memory cells can be employed for various embodiments of the present disclosure, such as phase-change memory, magneto-resistive memory, and so on.

Memory stack 100 can comprise an electrode 102, a switching material 104 and a second electrode 106. Electrode 102 and second electrode 106 are relatively electrically conductive, having higher conductivity, compared with switching material 104. In some embodiments, electrode 102 can be a metal—whether elemental or ionically bonded—and electrode 106 can be a doped silicon conductor, though the subject disclosure is not limited to these embodiments. In some embodiments, electrode 102 or second electrode 106 can be configured to generate ions (e.g., at a boundary with switching material 104) in response to an electric field applied to memory stack 100. In other embodiments, ions can be generated within switching material 104 in response to the electric field applied to memory stack 100. Switching material 104 can be selected to be at least in part permeable to these ions, such that ion migration can occur therein in response to the electric field, altering resistivity of switching material 104. A suitable erase signal can be provided to, at least in part, reverse or oppose the ion migration, thereby in whole or in part restoring the resistivity of switching material 104.

Referring now to FIG. 2, an alternative memory stack 200 is depicted. Memory stack 200 can comprise a top electrode 202 adjacent to an active metal layer 204. Top electrode 202 can serve as a first point of contact for applying an electric field to memory stack 200 (e.g., as part of performing a memory operation) in some disclosed embodiments. In addition, memory stack 200 can comprise a barrier layer 206, and a switching layer 208. In further embodiments, switching layer 208 or top electrode 202 can be substantially similar to switching layer 104 or top electrode 102 of FIG. 1, respectively, though the subject disclosure is not so limited. As depicted, memory stack 200 can also comprise a contact layer 210, a bottom electrode 212 over a substrate 214.

Generally, memory operations related to memory stack 200 can be performed in conjunction with application of a suitable electric field at top electrode 202 and bottom electrode 212. For instance, a program signal, erase signal, read signal, and so forth, can be applied to program, erase or read memory stack 200. In the context of programming, a program signal having a suitable program pulse width applied at top electrode 202 can cause ions from active metal layer 204 to migrate into switching layer 208. The ion migration can alter a measurable electrical characteristic of switching layer 208 (e.g., resistivity, conductivity, etc.), and of memory stack 200 in general, causing memory stack 200 to be in a program state. A capping layer of material, may be used in other embodiments, between layers 202 and 204. In various embodiments, capping layer may include Tungsten, titanium nitride, or the like.

The inventors of the subject disclosure have identified a source of variability in conjunction with programming two-terminal memory, such as memory stack 100 or memory stack 200, which can lead to degradation of a program state. This variability can relate, for instance, to electrical effects of ion migration within switching layer 208, and when during a program pulse the electrical effects of the program pulse undergo a significant non-linearity (e.g., see FIG. 4, infra). The inventors have identified that, as a result of uncertainty in when a memory stack actually becomes programmed, instability in the program state can occur. For instance, in the case of resistive-switching memory technology in which a filament of conductive ions is formed within switching layer 208 in response to the program signal, current conducted through memory stack 200 increases non-linearly as the filament of conductive ions forms (or completes) a conductive path through the otherwise electrically resistive switching layer 208. The completion of this conductive path and associated non-linear increase in current is referred to as a program event with respect to resistive-switching memory technology.

Figure 4:
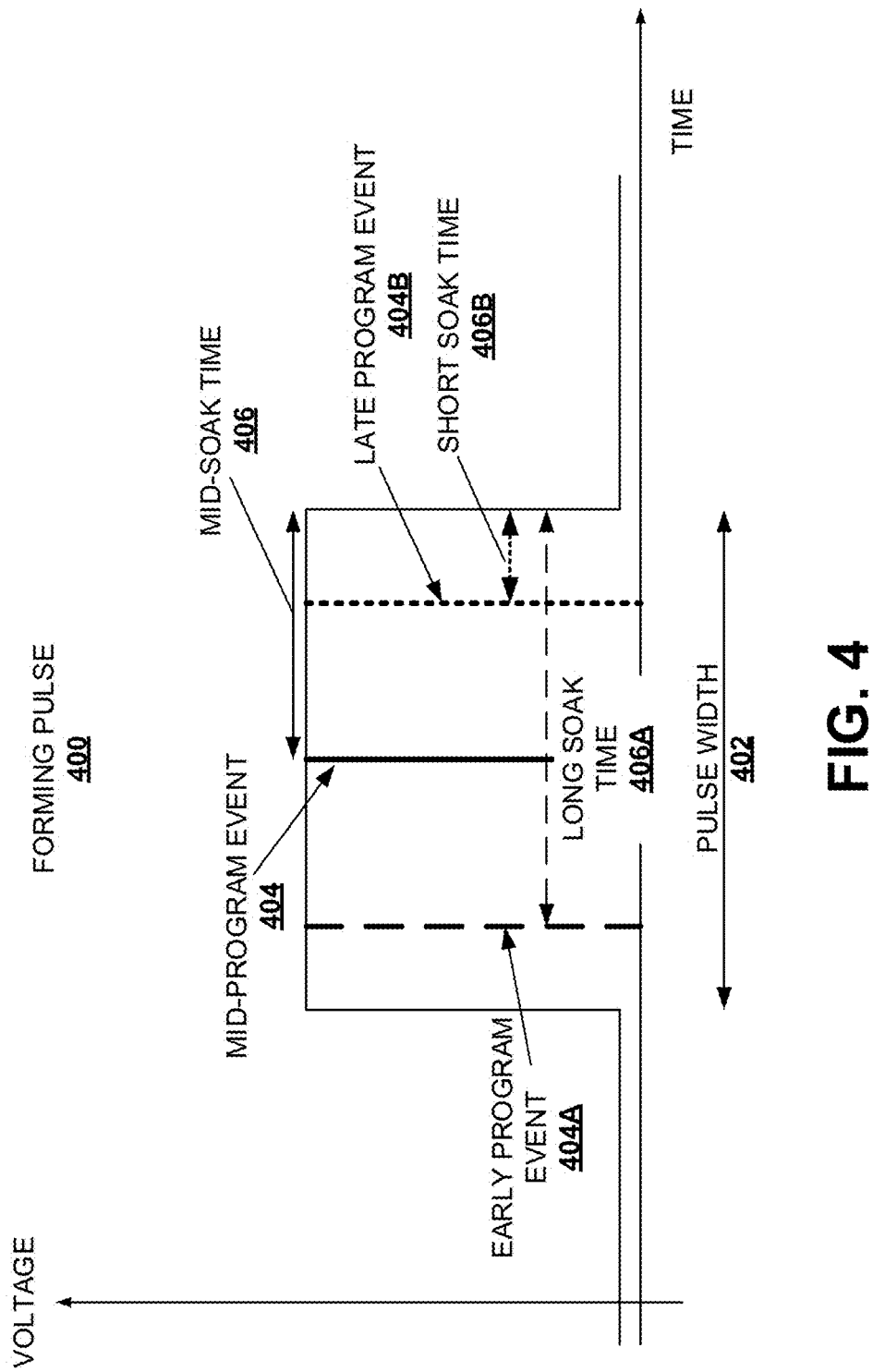
FIG. 4 illustrates a diagram of a sample forming pulse in conjunction with programming a two-terminal memory cell, in additional embodiments.

As depicted at FIG. 4, infra, the inventors have determined that an exact occurrence of a programming event within a programming pulse can vary. As a result, a two-terminal memory cell in a program state can be exposed to elevated current (e.g., associated with a program state for memory stack 200) for differing periods of time during the programming event, depending on an amount of time remaining in the programming pulse after the occurrence of the programming event. This exposure to program-state current levels is also referred to herein as a soak time. The inventors believe that shorter soak times can lead to instability of the program state—potentially resulting in memory loss—as well as reduced endurance in the two-terminal memory cell itself due to an additional programming step to recover the memory loss. To address this problem, various aspects of the subject disclosure provide for two-terminal memory programming that provides a minimum soak time, to provide improved memory stability and memory cell endurance.

Referring once again to memory stack 200, various materials can be employed for respective components of memory stack 200. Top electrode 202 can comprise conductive metal, doped silicon, or other suitable electrically conductive material (e.g., relative to switching layer 208). Active metal layer can comprise, for example, Ag, Au, Ti, TiN, Ni, Cu, Al, Cr, Ta, Fe, Mn, W, V, Co, Pt, Pd, or the like, suitable compounds thereof, or suitable combinations of the foregoing. In addition, barrier layer 206 can comprise a material suitable to mitigate or avoid oxidation of switching layer 208. In alternative or additional embodiments, barrier layer 206 can comprise a material suitable to control ion migration rate from active metal layer 204 to switching layer 208. Examples of materials for barrier layer 206 can include Ti, TiN, W, and others. Switching layer 208 can comprise a suitable electrically resistive material (e.g., as compared with top electrode 202, bottom electrode 212, active metal layer 204, contact layer 210, and so forth) that is at least in part permeable to ions generated by active metal layer 204. Some examples can include amorphous silicon, amorphized silicon, a silicon suboxide (e.g., $SiO_x$, where x is a number between 0.1 and 2), a SiGe compound, a SiGeO compound, a silicon oxide, an amorphous SiGe, or a $TaO_x$, $HfO_x$, $TiO_x$ (where x is a suitable positive integer), and so forth, or a suitable combination thereof. Contact layer 210 can comprise a doped silicon, a doped polysilicon, p-type or n-type polysilicon, p-type or n-type SiGe, and so forth. Bottom electrode 212 can comprise a conductive metal, a doped silicon or silicon compound, or the like, whereas substrate 214 can be an undoped silicon, undoped polysilicon, and so forth. In at least some embodiments, substrate 214 can be a complementary metal oxide semiconductor (CMOS) substrate, comprising one or more CMOS devices formed therein.

In some example embodiments, one or more other layers can be included in memory cell 200. For instance, an intermediary layer(s) can be instituted adjacent to one or more of the layers depicted in FIG. 2. As one example, a suitable material layer that mitigates or controls unintended oxidation of switching layer 208 can be positioned between one or more layers of memory cell 200, such as between contact layer 210 and switching layer 208. As another example, in some embodiments, memory cell 200 can have fewer layers than depicted in FIG. 2. For instance, top electrode 202 or bottom electrode 212 can be removed, and active metal layer 204 or contact layer 210 can electrically contact a conductive bitline or wordline of a memory array. Accordingly, it is to be appreciated that suitable variations of memory cell 200 known in the art or made known to one of ordinary skill in the art by way of the context provided herein are considered within the scope of the present disclosure.

Figure 3:
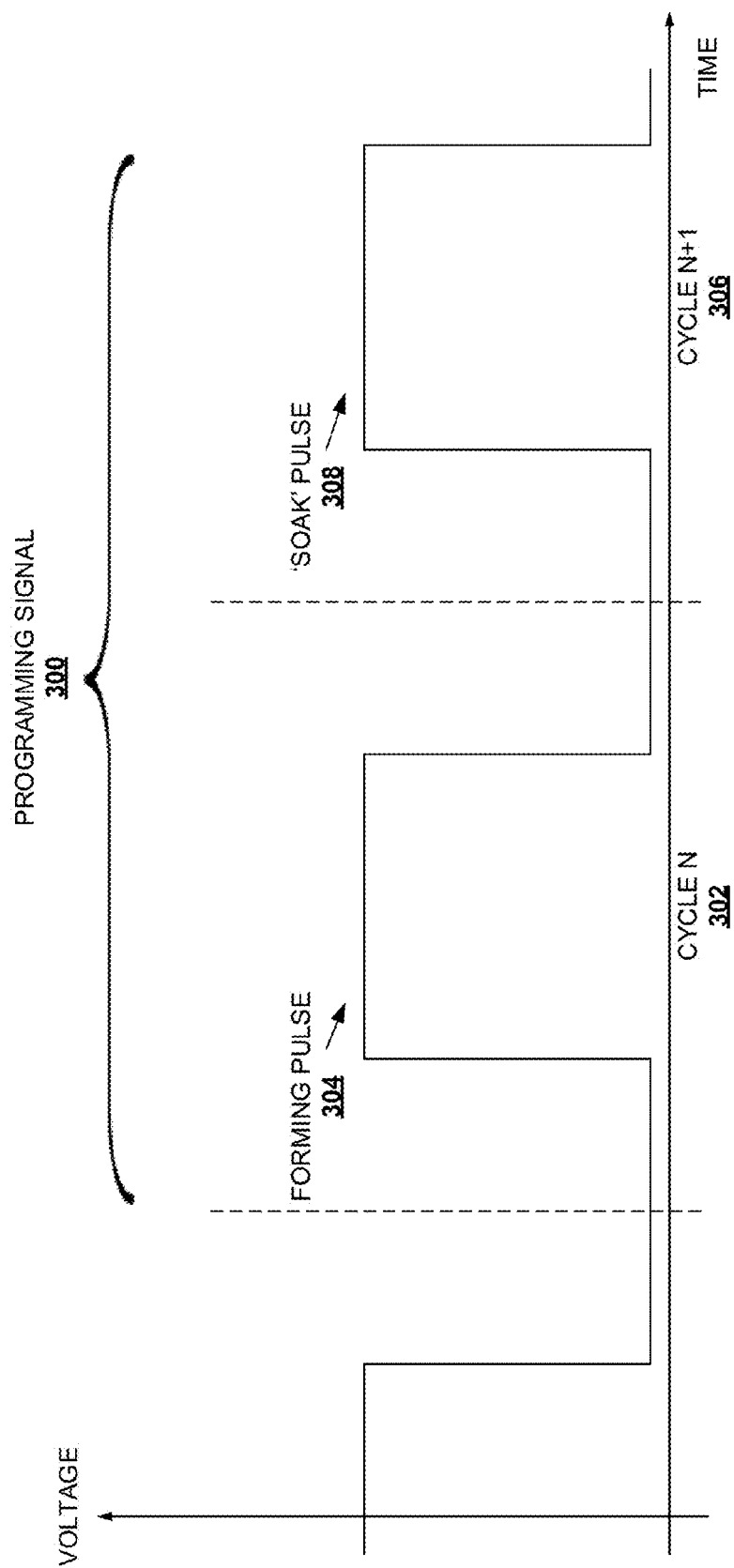
FIG. 3 depicts a diagram of an example multi-cycle programming pulse according to one or more embodiments.

FIG. 3 illustrates a diagram of a programming signal 300 configured for programming a two-terminal memory cell, according to one or more embodiments of the subject disclosure. Programming signal 300 is depicted on a two-axis graph, indicating voltage on a vertical axis and time on a horizontal axis. Accordingly, the graph depicts change in voltage magnitude of programming signal 300 as a function of time. It should be appreciated that programming signal 300 can have other characteristics depicted in other embodiments of the subject disclosure. For instance, programming signal 300 can be displayed as a function of current versus time, field magnitude versus time, or the like, and can be applied in conjunction with improved programming of two-terminal memory in related fashion to the programming signal 300 depicted by FIG. 3, as described herein.

Programming signal 300 is separated into cycles by vertical dashed lines, including cycle n 302 and cycle n+1 306. During cycle n 302, programming signal 302 can comprise a forming pulse 304 and during cycle n+1 306 programming signal 300 can comprise a follow-up pulse (also referred to as a soak pulse) 308. Although depicted as a step pulse, it should be appreciated that forming pulse 304 or follow-up pulse 308 can be another periodic or aperiodic pulse (e.g., sine wave, clipped sine wave, linear triangle pulse, nonlinear pulse, etc.), or the step pulse can be a quasi step-pulse with non-instantaneous change(s) in voltage at respective cycle initiation or during subsets thereof (e.g., see FIG. 6, infra).

Forming pulse 304 can be configured to cause a two-terminal memory cell to change to a program state. Forming pulse 304 can have different characteristics for differing types of two-terminal memory technology (e.g., resistive-switching technology, phase-change technology, magneto-resistive technology, and so forth). As an example, forming pulse 304 can have a voltage magnitude within a range of about 0.7 volts to about 6 volts. Although not depicted, a voltage limiting circuit can be employed to cap the voltage of forming pulse 304, to mitigate or avoid over-driving the two-terminal memory cell being programmed. (An example voltage limiting circuit can be a terminator circuit described in U.S. patent application Ser. No. 13/531,449 filed Jun. 22, 2012, assigned to the assignee hereof and expressly incorporated by reference herein in its entirety and for all purposes.) Additionally, forming pulse 304 can have a current compliance to limit current conducted by the two-terminal memory cell being programmed to a maximum current. The current compliance can be in a range from about 100 nanoAmps (nA) to about 300 microAmps (μA), in various embodiments. Additionally forming pulse 304 can have a pulse width within a range of about 10 nanoseconds (ns) to about 10 microseconds (μs). In at least one embodiment, current compliance associated with forming pulse 304 can be inversely related to the pulse width of forming pulse 304. For instance, current compliance can be near a lower end of the above-given current compliance range (e.g., about 100 nA to a few hundred nA) for pulse widths near the longer end of the above-given pulse width range (e.g., several μs to about 10 μs). Likewise, current compliance can be near an upper end of the above-given current compliance range (e.g., a few μA to about 300 μA) for pulse widths near the lower end of the above-given pulse width range (e.g., about 10 ns to a few dozen or a few hundred ns).

In general, forming pulse 304 is configured to cause a two-terminal memory cell to change to a program state. In response to the change to the program state, the two-terminal memory cell often observes a significant change in characteristics of the forming pulse. For instance, in the case of resistive-switching memory, current flow through the two-terminal memory cell can increase non-linearly following the change to the program state. This increased current can have the positive effect of stabilizing the program state (e.g., stabilizing a conductive filament of ions with switching layer 208), leading to a reliable, durable program state. However, an amount of time which the programmed memory cell is exposed to the increased current can vary, leading in the inventors' opinion to significant variability in the durability of the program state.

To address this variability, soak pulse 308 is activated after completion of forming pulse 304, during cycle n+1 306. In various embodiments, soak pulse 308 can have at least one differing signal characteristic from forming pulse 304. For instance, soak pulse 308 can have a different voltage magnitude, current compliance, pulse width, or the like, or a suitable combination thereof. In at least one alternative embodiment, however, soak pulse 308 can have the same or substantially similar electrical characteristics as forming pulse 304. Furthermore, soak pulse 308 can be configured to provide durability for the program state of a programmed two-terminal memory cell. Accordingly, the electrical characteristics of soak pulse 308 (e.g., current compliance, voltage, field magnitude, pulse width, etc.) can be selected at least in part based generally on the technology of the two-terminal memory cell, and particularly on providing durability for the program state. As an example, pulse width for soak pulse 308 can be from a few ns (e.g., 200 ns, 300 ns, 400 ns, etc.) to a few ten of μs (e.g., 20 μs, 30 μs, 40 μs, and so forth). In at least one embodiment, the pulse width for soak pulse 308 can be about 100 μs. In other embodiments, current compliance for soak pulse 308 can be between about 100 nA and about 300 μA; in a particular embodiment(s), current compliance for soak pulse 308 can be of smaller magnitude than current compliance for forming pulse 304. In still other embodiments, voltage for soak pulse 308 can be between about 0.7 and about 6 volts; and in at least one embodiment, voltage for soak pulse 308 can be of smaller magnitude than voltage of forming pulse 304.

FIG. 4 depicts a diagram of an example forming pulse 400 according to additional embodiments of the subject disclosure. In one example, forming pulse 400 can be substantially similar to forming pulse 304 of FIG. 3, supra, although the subject disclosure is not limited to this example. Forming pulse 400 can have suitable electrical characteristics, including voltage, pulse width, field magnitude, or current compliance, or the like, or a suitable combination thereof, suitable to cause a target two-terminal memory cell to change to a program state (e.g., become programmed). These electrical characteristics can vary on a technology of the two-terminal memory cell (e.g., resistive-switching memory, phase-change memory, magneto-resistive memory, etc.), how the two-terminal memory cell is constructed (e.g., composition of memory stack layers, size of the memory cell, current-carrying capacity, inherent electrical resistivity, etc.), or other suitable characteristics.

Forming pulse 400 illustrates three example programming events, including early program event 404A, mid-program event 404 and late program event 404B. Though forming pulse 400 is configured to cause a two-terminal memory cell to change state to a program state, this change can occur at various times within a pulse width 402 of forming pulse 400. For instance, early program event 404A occurs relatively early in pulse width 402. Likewise, mid-program event 404 occurs at a relatively median point in pulse width 402, and late program event 404B occurs relatively toward an end of pulse width 402. As a result, soak times for respective ones of early program event 404A, mid-program event 404 and late program event 404B will vary, as depicted by long soak time 406A (associated with early program event 404A), mid-soak time 406 (associated with mid-program event 404) and short soak time 406B (associated with late program event 404B). This variability in soak times can lead to program state instability or reduced endurance in some two-terminal memory cells (e.g., those having short soak time 406B).

In an array of two-terminal memory cells having a large number of individual memory cells, some percentage of these memory cells receiving having short soak time 406B could lead to a comparable percentage of the memory cells having less than optimal program state stability or long-term endurance. Accordingly, aspects of the subject disclosure provide a minimum soak pulse time for programming two-terminal memory. This minimum soak pulse time can follow programming of the two-terminal memory cell to improve program state stability and memory cell endurance. Furthermore, the minimum soak pulse time can be provided as a separate pulse in a separate clock cycle in some embodiments (e.g., see FIG. 3, supra, or FIG. 5 or 6, infra) or as an extended pulse (e.g., following detection of a program event) in the same clock cycle as the forming pulse 400 in other embodiments, or extending into a subsequent clock cycle, in alternative embodiments (e.g., see FIG. 7, infra).

Figure 5:
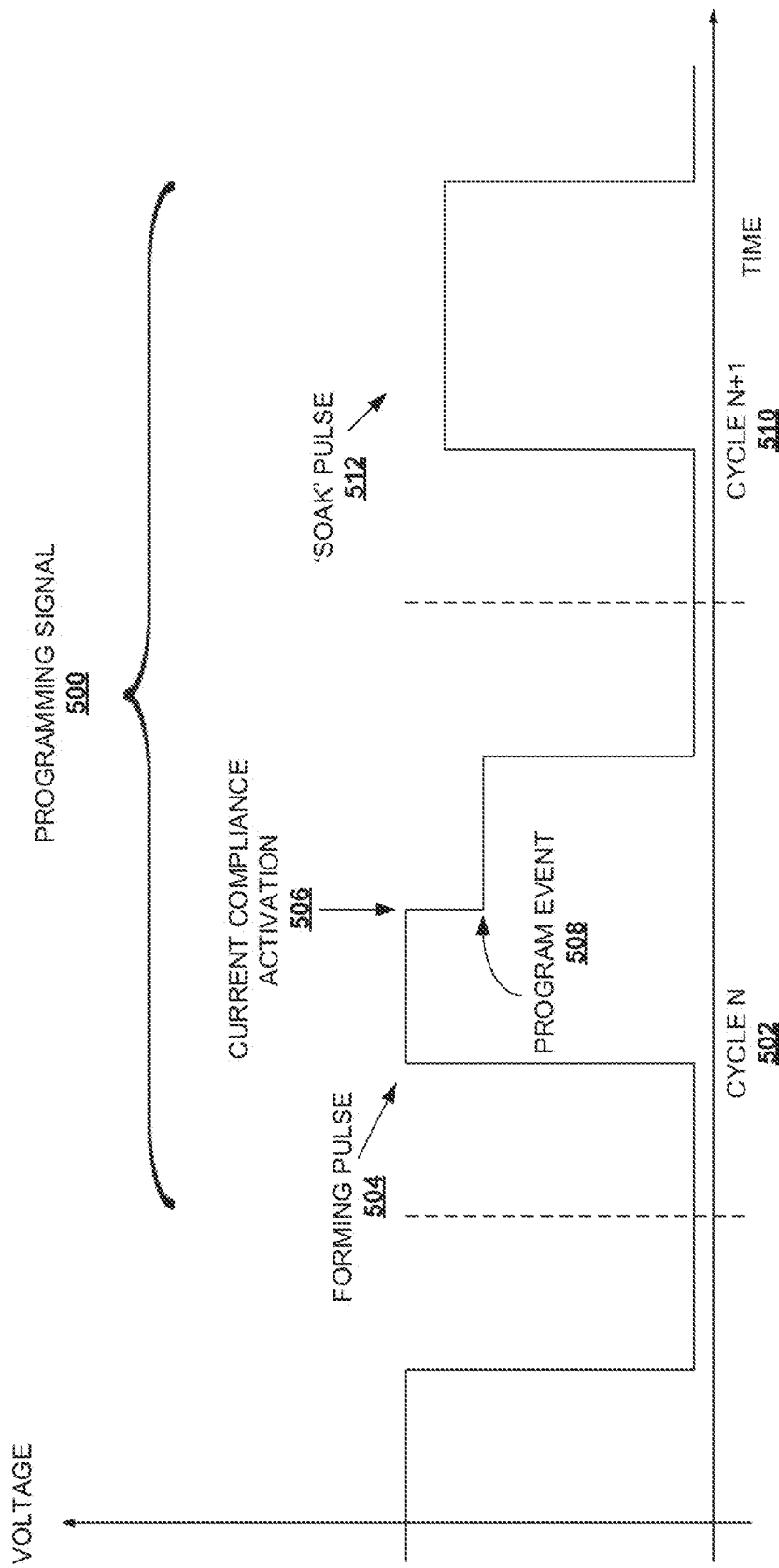
FIG. 5 depicts a diagram of a sample programming signal employing current compliance or voltage compliance, in an embodiment(s)

Referring now to FIG. 5, there is depicted a programming signal 500 for providing a minimum soak pulse time following programming of a two terminal memory cell, according to further aspects of the subject disclosure. Two cycles of programming signal 500 are illustrated by FIG. 5, including cycle n 502 and cycle n+1 510, though it is to be understood that programming signal 500 is not limited to this number of cycles. During cycle n 502 a forming pulse 504 is provided for programming signal 500. Forming pulse 504 can be configured to cause a change in program state of a two-terminal memory (e.g., from a non-program state to a program state, from a first program state to a second program state in the case of a multi-level cell, or the like). Accordingly, forming pulse 504 can have suitable electrical characteristics, such as pulse width (e.g., having a value within a range between about 10 ns and about 100 µs), voltage (e.g., having a value within a range between about 0.7 volts and about 6 volts), current compliance (e.g., having a value within a range between about 100 nA and about 300 µA). In at least one embodiment, forming pulse can have a pulse width of about 100 µs, a voltage of about 1.5 volts and a current compliance of in a range of about 10 µA to about 20 µA, though many other embodiments will employ different electrical characteristics for forming pulse 504.

According to one or more embodiments, a current compliance circuit or voltage terminator circuit can be employed to limit current of forming pulse 504, or change or modify voltage of forming pulse 504 (e.g., in response to satisfaction of a programmed condition). For example, refer to U.S. patent application Ser. No. 13/531,449 for one example of a voltage terminator circuit and related operation. As a further example, refer to U.S. patent application Ser. No. 13/761,132 for an example current compliance circuit and an additional example of a voltage terminator circuit. The current compliance circuit can be employed to limit a maximum amount of current supplied to program a two-terminal memory cell as part of forming pulse 504. Furthermore, the current compliance circuit (or an associated circuit) can be configured to identify a current compliance activation 506, in which the current compliance circuit limits current supplied to the two-terminal memory cell. Current compliance activation 506 can be utilized to infer occurrence of a program event 508 for the two-terminal memory cell. In some embodiments, current compliance activation 506 can serve as a condition for changing voltage of forming pulse 504, as depicted by programming signal 500. This can be accomplished by activating a voltage terminator circuit for increasing or decreasing voltage in response to a condition (e.g., current compliance activation 506, or other suitable mechanism for detecting program event 508). Thus, for instance, utilizing the current compliance circuit and the voltage terminator circuit, a first voltage can be provided for forming pulse 504 that is configured to facilitate programming the two-terminal memory cell, and a second voltage can be provided for forming pulse 504 that is configured to promote a stable program state in response to detecting the programming of the two-terminal memory cell. Although forming pulse 504 illustrates the second voltage (e.g., after program event 508) as being smaller than the first voltage (e.g., prior to program event 508), in alternative embodiments the second voltage can be higher than the first voltage, or can be the same or substantially the same as the first voltage.

Because program event 508 can occur at various times during cycle n 502, a soak pulse 512 is applied to the two-terminal memory cell in cycle n+1 510. According to the inventors, a two-terminal memory cell can be programmed to a desired current or conductivity value, but may not retain the conductivity value for long. In the case of resistive memory, the inventors attribute this phenomenon to unstable filament formation in a switching medium of a resistive two terminal memory cell, in at least some cases. The inventors believe that formation of a conductive filament is more likely to become unstable if a newly formed conductive filament is not exposed to a sufficient current for a sufficient amount of time. This can occur, for instance, where program event 508 occurs late within cycle n 502 and thus a soak time during forming pulse 504 is relatively small (e.g., see FIG. 4, supra). Accordingly, various embodiments of the subject disclosure provide a soak pulse 512 provided as a follow-up pulse to forming pulse 504.

In this capacity, soak pulse 512 can provide a newly programmed two-terminal memory cell with program-state current (e.g., at current magnitudes near or at the current compliance set for the current compliance circuit, discussed above) for a time equal at least to the pulse width of soak pulse 512. This program-state current can help to stabilize the newly formed conductive filament, increasing memory cell endurance, providing longer memory retention and higher memory cell uniformity for an array of such memory cell.

In various embodiments, programming signal 500 can be provided with current compliance or without current compliance. In other embodiments, programming signal 500 can be provided with voltage control (e.g., a voltage terminator circuit) or without voltage control. For instance, programming signal 500 can be provided with a constant voltage, rather than a variable voltage, or a voltage that changes in response to occurrence of a programmed condition (e.g., detection of program event 508). In at least some embodiments, current compliance and voltage control can be provided, but with a different logical programming (e.g., cause and effect relationship) than described above (e.g., see FIG. 6, infra).

Figure 6:
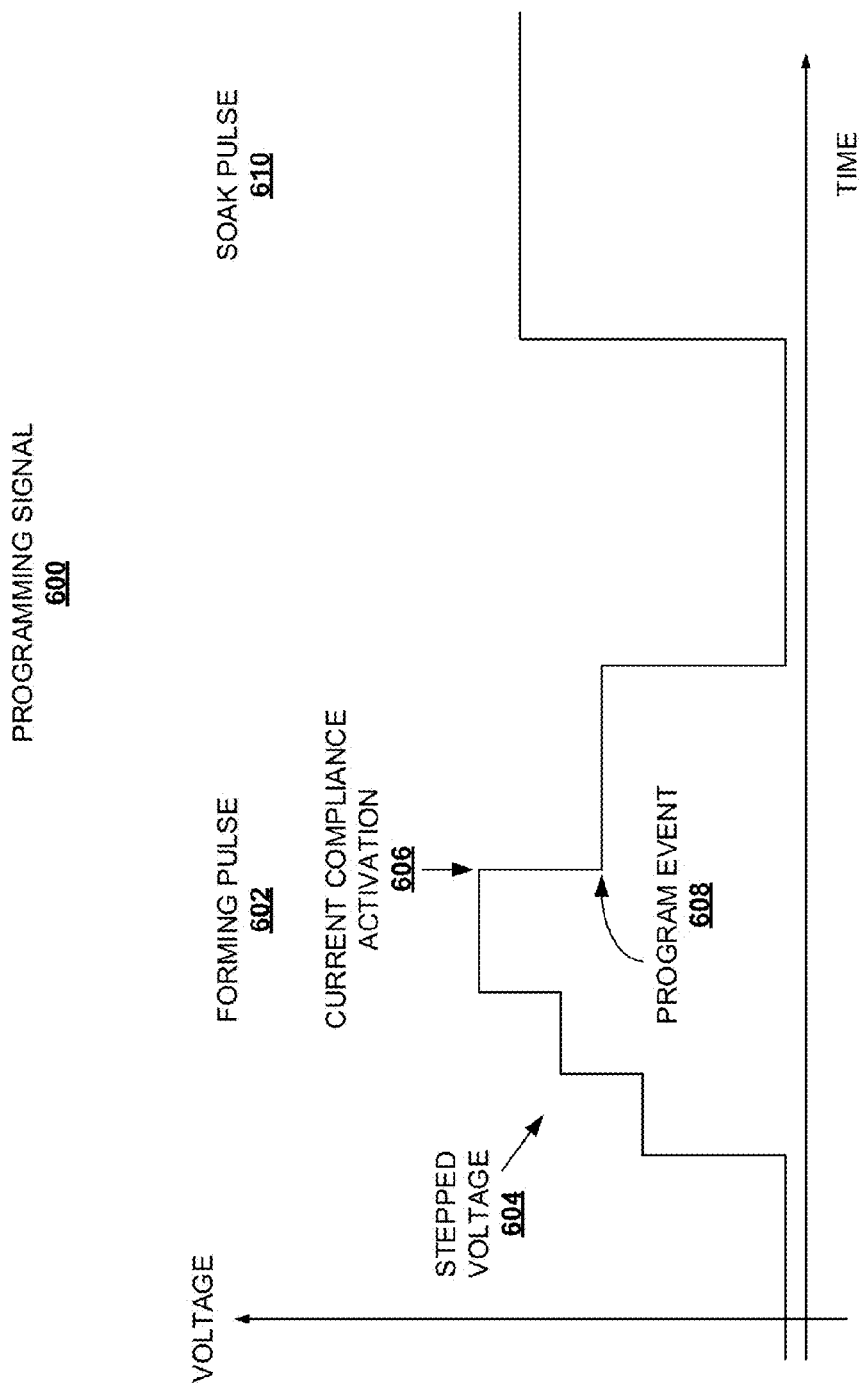
FIG. 6 illustrates a diagram of an example alternative programming signal comprising a stepped-voltage forming pulse, in further embodiments.

FIG. 6 illustrates a block diagram of an example programming signal 600 for providing improved memory retention and longevity in two-terminal memory, according to alternative or additional embodiments of the subject disclosure. As depicted, programming signal 600 can comprise a forming pulse 602 and a soak pulse 610. In some embodiments, forming pulse 602 and soak pulse 610 can be separate pulses in separate clock cycles of programming signal 600. In alternative or additional embodiments, forming pulse 602 and soak pulse 610 can be concatenated into a single pulse spanning one or more clock cycles (e.g., see FIG. 7, infra).

Forming pulse 602 can comprise a stepped voltage 604 that increases non-linearly over subsets of a pulse width of forming pulse 602. Respective voltage values of stepped voltage 604 can be pre-programmed as part of programming signal 600. The respective voltage values can be configured to increase a likelihood that a two-terminal memory cell is programmed near a median point of the pulse width of forming pulse 602, by providing lower voltages at an earlier point, and increasingly higher voltages for successive subsets of forming pulse 602, where each higher voltage step of stepped voltage 604 increases probability of programming a two-terminal memory cell during a subset of the pulse width in which the voltage step is applied. By increasing likelihood of programming near the median point of the pulse width, forming pulse 602 can provide a greater degree of uniformity in actual program times of a group of two-terminal memory cells, for instance, reducing soak time variability.

In addition to the foregoing, current compliance activation 606 can be provided for forming pulse 602. As discussed above at FIG. 5, supra, current compliance activation can be detected in response to current draw of a two-terminal memory cell reaching a predetermined current limit. The current compliance can then cap the current available to the two-terminal memory cell at (or below, by reducing current in response to current compliance activation 606) the predetermined current limit. In addition, current compliance activation 606 can be used to infer a program event 608 associated with the two-terminal memory cell. In at least some embodiments, current compliance activation 606 can be coupled with voltage control. The voltage control can be implemented in response to current compliance activation 606 in some embodiments. Furthermore, the voltage control can be implemented as an override to stepped voltage 604, terminating the predetermined voltage steps of stepped voltage 604. As one example, the voltage control can implement a constant voltage for a remainder of forming pulse 602, in response to current compliance activation 606. The constant voltage can be equal to, greater than, or less than (as depicted by FIG. 6) a voltage of forming pulse 602 when current compliance activation 606 occurs.

In addition to the foregoing, programming signal 600 can comprise a soak pulse 610. Soak pulse 610 can be configured to follow program event 608, and provide a program current to a newly programmed two-terminal memory cell for a minimum duration equal to a pulse width of soak pulse 610. In conjunction with stepped voltage 604, soak pulse 610 can increase uniformity of soak times of a group of such memory cell. For instance, soak pulse 610 provides the newly programmed memory cell a minimum exposure to the program current, in addition to stepped voltage 604 increasing probability of program event 608 occurring near a median time of the pulse width of forming pulse 602.

In some embodiments, soak pulse 610 can have the same electrical characteristics as forming pulse 602. In other embodiments, soak pulse 610 can have at least one different electrical characteristic as forming pulse 602. In still other embodiments, soak pulse 610 can have multiple different electrical characteristics as forming pulse 602. For instance, soak pulse 610 can have a different voltage value(s) than forming pulse 602, a different pulse width, different current compliance, or different field magnitude, or the like. In addition, soak pulse 610 can have a constant voltage, or can have a stepped voltage similar to stepped voltage 604, with programmed voltage values and pulse sub-widths of the same or different values as compared with forming pulse 602, in further embodiments. Generally, soak pulse 610 can be configured to improve stability, endurance and reliability of programmed two-terminal memory, whereas forming pulse 602 can be configured to cause the program state to occur, and optionally to cause the program state to occur with greater uniformity for a group of memory cells. Accordingly, it should be appreciated that soak pulse 610 and forming pulse 602 can be respectively configured in a manner suitable to achieve these or similar objectives.

Figure 7:
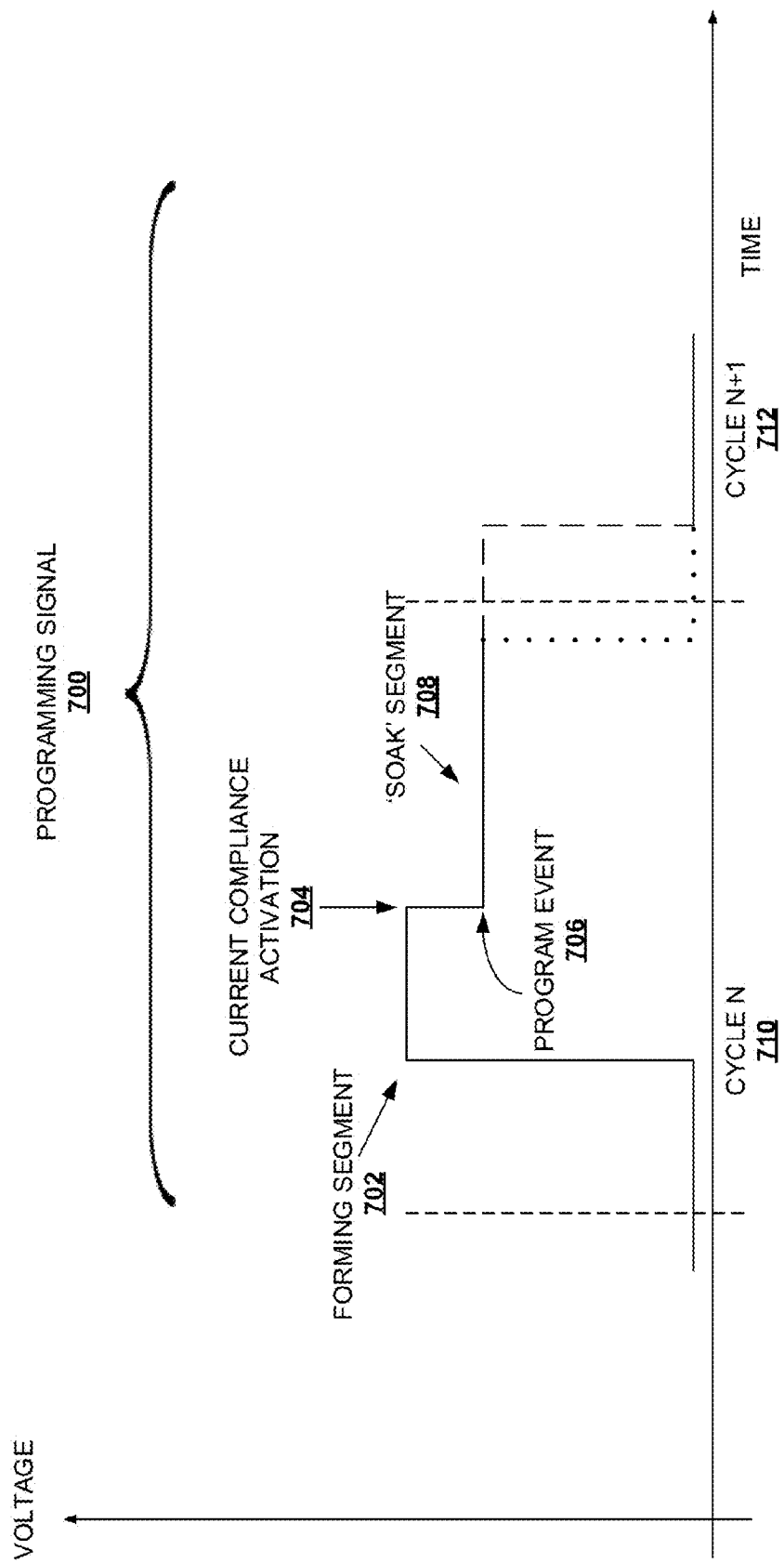
FIG. 7 depicts a flowchart of a sample method for providing improved programming for two-terminal memory in one or more additional embodiments.

FIG. 7 depicts a diagram of an example programming signal 700 according to alternative or additional embodiments of the present disclosure. Programming signal 700 can comprise a single pulse having a plurality of segments. For instance, programming signal 700 can have a forming segment 702 and a soak segment 708. Moreover, forming segment 702 and soak segment 708 can be configured to have different respective electrical characteristics (e.g., voltage, current compliance, duration, field magnitude, etc.), as described herein. For instance, forming segment 702 can be configured to cause a program event in a two-terminal memory cell, and optionally to improve uniformity of program times of a group of such memory cell, whereas soak segment 708 can be configured to improve stability of a programmed two-terminal memory cell.

In at least some disclosed embodiments, programming signal 700 can terminate and soak segment 708 can initiate in response to a current compliance activation 704 and associated program event 706 of a memory cell. Thus, in response to current compliance activation 704 or program event 706, one or more electrical characteristics of forming segment 702 can be altered to generate soak segment 708, based on the suitable characteristics to achieve the respective functions thereof.

In further embodiments, programming signal 700 can be implemented within a single clock cycle, or can extend across multiple clock cycles. For instance, programming signal 700 can initiate and terminate entirely within a single clock cycle, such as cycle n 710, or can initiate in clock cycle n 710 and can terminate in a subsequent clock cycle, such as clock cycle n+1 712 (or e.g., a clock cycle n+2, cycle n+3, and so forth). The dotted line near the end of cycle n 710 illustrates the former single clock cycle example, whereas the dashed line extending into cycle n+1 712 illustrates the latter multi-clock cycle example.

Programming signal 700 can provide an efficient mechanism to achieve a minimum soak pulse time for a two-terminal memory cell, in various embodiments. For instance, by applying soak segment 708 in response to detection of program event 706, substantial improvement in soak time uniformity for a group of memory cells can be achieved. For instance, by establishing a constant pulse width for soak segment 708 for each of the group of memory cells, the soak time for respective ones of the memory cells can be substantially the same, even without a uniformity of program times during forming segment 702. In various embodiments, current compliance or voltage control (e.g., via a voltage terminator circuit) can be employed in conjunction with programming signal 700 to achieve the functionality described above. For instance, a current compliance circuit can be employed to limit maximum current supplied to a memory cell, as well as identify activation of the current limit (e.g., current compliance activation 704). Further, a voltage terminator circuit can be employed to change voltage of programming signal 700 in response to current compliance activation 704, affecting a different voltage for soak segment 708 as provided for forming segment 702. In at least one embodiment, a suitable voltage control circuit can be employed to provide stepped voltage for forming segment 702, or for soak segment 708—whether in increasing steps, decreasing steps, or some other suitable pattern—or a combination thereof. Accordingly, it should be appreciated that the example illustrated by programming signal 700 is but one embodiment for achieving these or related objectives.

The aforementioned diagrams have been described with respect to several components (e.g., layers) of a memory cell, or memory operations associated with such memory cells. It should be appreciated that in some suitable alternative aspects of the subject disclosure, such diagrams can include those components and operations specified therein, some of the specified components/operations, or additional components/operations. Sub-components can also be implemented as electrically connected to other sub-components rather than included within a parent component/layer. For example, an intermediary layer(s) can be instituted adjacent to one or more of the disclosed layers. As one example, a suitable barrier layer that mitigates or controls unintended oxidation can be positioned between one or more disclosed layers. In yet other embodiments, a disclosed memory stack or set of film layers can have fewer layers than depicted. For instance, a switching layer can electrically contact a conductive wire directly, rather than having an electrode layer or contact layer there between. Additionally, it is noted that one or more disclosed processes can be combined into a single process providing aggregate functionality. Components of the disclosed architectures can also interact with one or more other components not specifically described herein but known by those of skill in the art or made known to those of skill in the art by way of the context provided herein.

Figure 8:
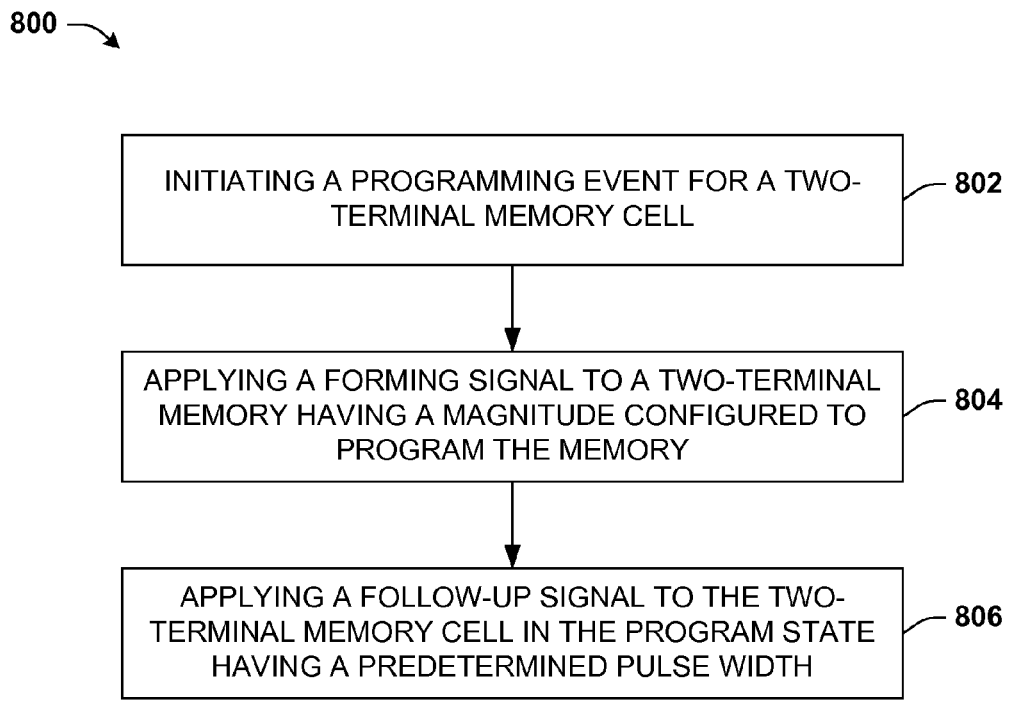
FIG. 8 illustrates a flowchart of an example method for multi-cycle programming for two-terminal memory in an embodiment(s)
Figure 9:
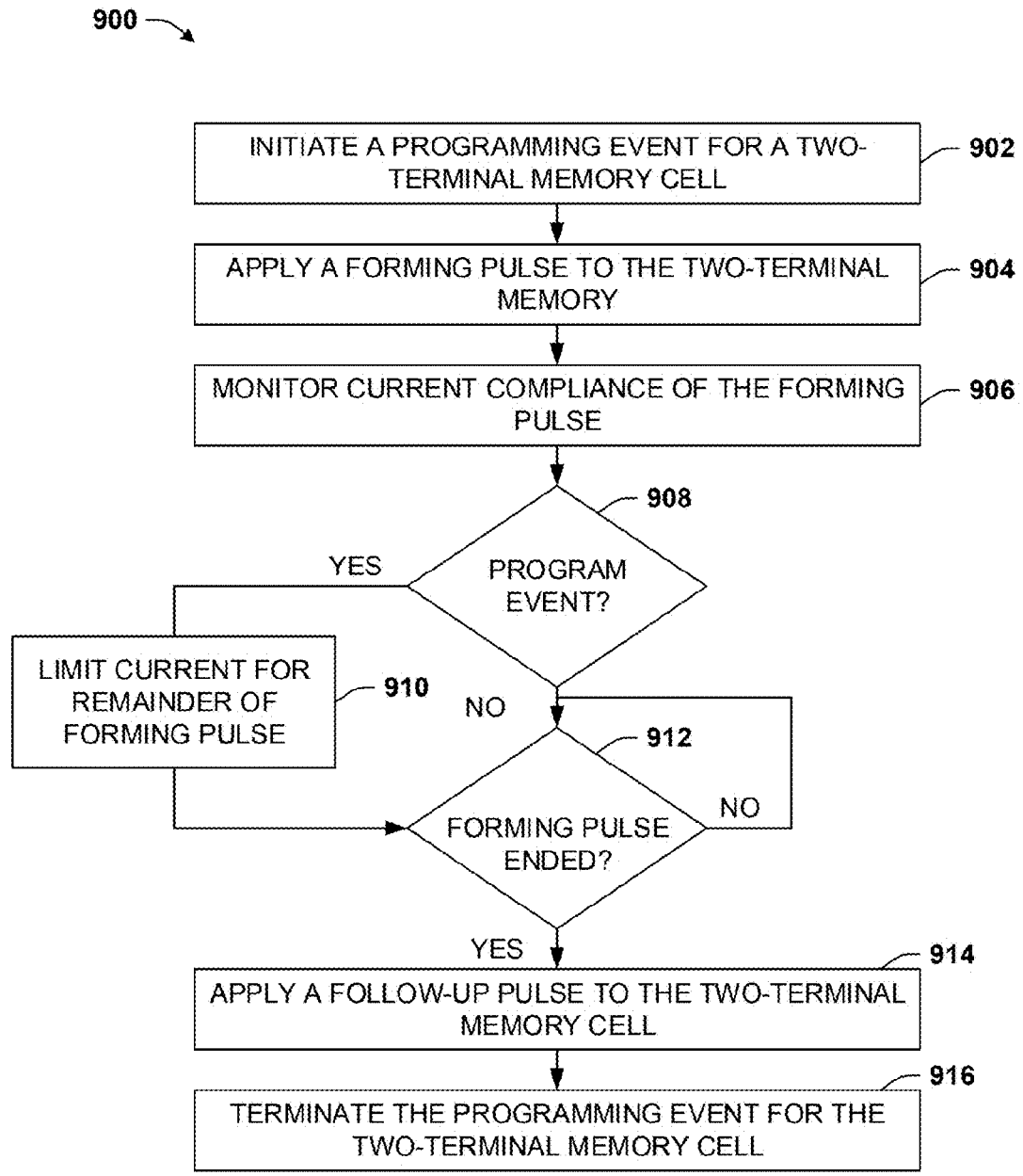
FIG. 9 depicts a flowchart of a sample method for multi-cycle programming for two-terminal memory in still other embodiments.
Figure 10:
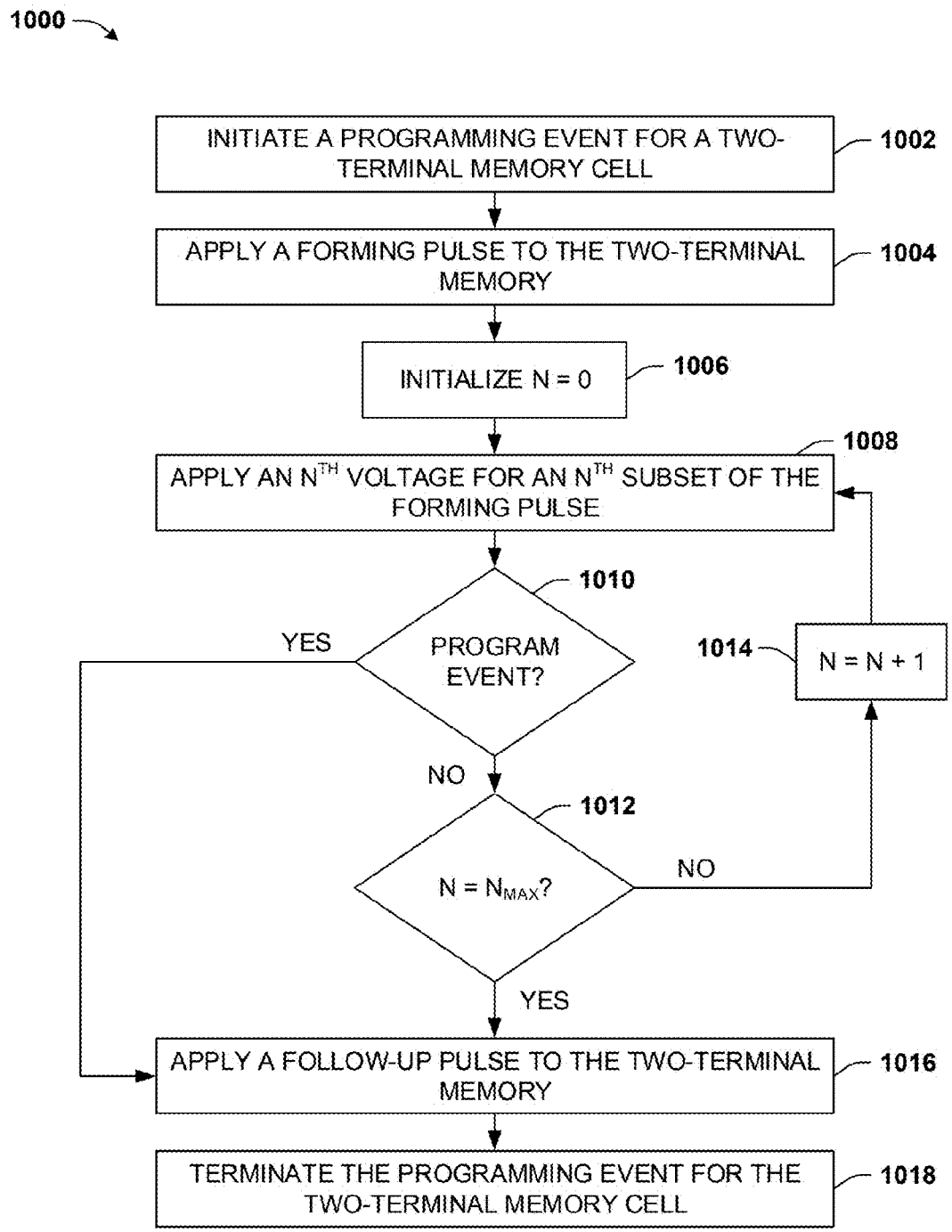
FIG. 10 illustrates a block diagram of a sample operating and control environment for a memory device according to various disclosed embodiments.

In view of the exemplary diagrams described supra, process methods that can be implemented in accordance with the disclosed subject matter will be better appreciated with reference to the flow charts of FIG. 8-10. While for purposes of simplicity of explanation, the methods of FIGS. 8-10 are shown and described as respective series of blocks, it is to be understood and appreciated that the claimed subject matter is not limited by the order of the blocks, as some blocks may occur in different orders or concurrently with other blocks from what is depicted and described herein. Moreover, not all illustrated blocks are necessarily required to implement the respective methods described herein. Additionally, it should be further appreciated that the methods disclosed throughout this specification are capable of being stored on an article of manufacture to facilitate transporting and transferring such methodologies to an electronic device. The term article of manufacture, as used, is intended to encompass a computer program accessible from any computer-readable device, device in conjunction with a carrier, or storage medium. In addition, such an article of manufacture can include a compact Flash memory card, a universal serial bus memory card, a secure digital card or the like (e.g., mini SD, micro SD, etc.), or other suitable article of manufacture facilitating storage of digital information or portable storage of digital information.

Referring now to FIG. 8, there is illustrated a flowchart of a method 800 for providing improved program state stability and endurance in two-terminal memory, according to alternative or additional aspects of the subject disclosure. At 802, method 800 can comprise initiating a programming event for a two-terminal memory cell. The two-terminal memory cell can be one of multiple suitable technologies. Examples include resistive memory, phase-change memory, magneto-resistive memory, and so forth.

At 804, method 800 can comprise applying a forming signal to the two-terminal memory cell. In various embodiments, the forming signal can have one or more electrical characteristics configured to program the two-terminal memory cell. Example characteristics can include current compliance, voltage, pulse width, field magnitude, or the like, or a suitable combination thereof. In some embodiments, the forming signal can have a current compliance in a range of about 100 nA to about 300 µA. In other embodiments, the forming signal can have a voltage in a range from about 0.7 volts to about 6 volts. In still other embodiments, the forming signal can have a pulse width within a range of about 10 ns to about 10 µs, though in at least one embodiment the pulse width can be larger (e.g., about 100 µs). Furthermore, method 800 can comprise providing an inverse ratio of pulse width and current compliance, in which pulse width is a within a lower end of a suitable pulse width range for a current compliance at a higher end of a suitable current compliance range, or vice versa.

At 806, method 800 can comprise applying a follow-up signal (e.g., a soak pulse or soak segment) to the two-terminal memory cell. The follow-up signal can be applied to the program state of the two-terminal memory cell, for instance. Moreover, the follow-up signal can have a predetermined electrical characteristic (e.g., current compliance, voltage, pulse width, field magnitude, and so on) configured to provide program state stability for the two-terminal memory cell.

In an embodiment(s), method 800 can comprise providing the follow-up signal with a signal characteristic having a different value from a corresponding signal characteristic of the forming signal. For instance, method 800 can comprise providing the follow-up signal with a different pulse time than a corresponding pulse time of the forming signal. In another example, method 800 can comprise providing the follow-up signal with a different field magnitude than a corresponding field magnitude of the forming signal. In still other examples, method 800 can comprise providing the follow-up signal with a different current compliance than a corresponding current compliance of the forming signal. In yet other examples, a combination of the foregoing can be provided. Alternatively, in some embodiments, the follow-up signal can have the same or substantially the same electrical characteristics as the forming signal.

According to additional embodiments, method 800 can comprise initiating the follow-up signal at a predetermined time following completion of the forming signal. In other embodiments, method 800 can comprise detecting occurrence of the state change of the two-terminal memory cell, and initiating the follow-up signal in response to detecting the occurrence of the state change. In one alternative embodiment, method 800 can comprise terminating the forming signal and activating the follow-up signal in response to detecting the occurrence of the state change. In another alternative embodiment, method 800 can comprise modifying the forming signal to become the follow-up signal (e.g., changing an electrical characteristic(s) of the forming signal to that of the follow-up signal) in response to detecting the occurrence of the state change.

FIG. 9 illustrates a flowchart of an example method 900 according to still other embodiments of the present disclosure. At 902, method 900 can comprise initiating a programming event for a two-terminal memory cell. At 904, method 900 can comprise applying a forming pulse to the two-terminal memory cell. At 906, method 900 can comprise monitoring a current compliance of the forming pulse. At 908, a decision can be made as to whether a program event has occurred for the two-terminal memory cell. In response to the program event occurring, method 900 can proceed to 910; otherwise, method 900 can proceed to 912.

At 910, method 900 can comprise limiting current for a remainder of the forming pulse. Current can be limited as part of a current compliance circuit, in some embodiments. In addition to the foregoing, a voltage of the forming pulse can optionally be altered (e.g., increased, decreased) in response to occurrence of the program event.

At 912, method 900 can comprise determining whether a forming pulse has ended. If so, method 900 can proceed to 914. Otherwise, method 900 repeats reference number 912 until the forming pulse ends.

At 914, method 900 can comprise applying a follow-up pulse to the two-terminal memory cell. In various embodiments, the follow-up pulse can have the same or different electrical characteristics as the forming pulse. Additionally, the follow-up pulse can be combined with the forming pulse as a monolithic pulse, or can be distinct pulses (e.g., respectively initiated in different clock cycles of a program signal). At 916, method 900 can comprise terminating the programming event for the two-terminal memory cell.

Referring to FIG. 10, there is depicted a flowchart of a sample method 1000 for providing improved endurance and memory retention in two-terminal memory. At 1002, method 1000 can comprise initiating a programming event for a two-terminal memory cell. At 1004, method 1000 can comprise applying a forming pulse to the two-terminal memory cell. At 1006, method 1000 can comprise initializing N=0. At 1008, method 1000 can comprise applying an $N^{th}$ voltage for an $N^{th}$ subset of the forming pulse. At 1010, a decision is made as to whether a program event has occurred for the two-terminal memory cell. If the program even occurs, method 1000 can proceed to 1016; otherwise method 1000 can proceed to 1012.

At 1012, a decision is made as to whether $N=N_{max}$. $N_{max}$ can be set to a maximum sub-pulse of a stepped voltage program for the forming pulse (e.g., as depicted at stepped voltage 604 of FIG. 6, supra). If $N=N_{max}$, method 1000 can proceed to 1016; otherwise method 1000 can proceed to 1014 where N is incremented, and method 1000 then returns to reference number 1008. As depicted, reference numbers 1008 through 1014 can provide a stepped voltage loop for the forming signal, whereupon the stepped voltage loop is terminated in response to the program event occurring or N reaching $N_{max}$.

At 1016, method 1000 can comprise applying a follow-up pulse to the two-terminal memory cell. The follow-up pulse can be an extension of the forming pulse (optionally with one or more different electrical characteristics), or can be initiated in a subsequent clock cycle following termination of the forming pulse. At 1018, method 1000 can comprise terminating the programming event for the two-terminal memory cell.

In various embodiments of the subject disclosure, disclosed memory architectures can be employed as a standalone or integrated embedded memory device with a CPU or microcomputer. Some embodiments can be implemented, for instance, as part of a computer memory (e.g., random access memory, cache memory, read-only memory, storage memory, or the like). Other embodiments can be implemented, for instance, as a portable memory device. Examples of suitable portable memory devices can include removable memory, such as a secure digital (SD) card, a universal serial bus (USB) memory stick, a compact Flash (CF) card, or the like, or suitable combinations of the foregoing. (See, e.g., FIGS. 11 and 12, infra).

NAND FLASH is employed for compact FLASH devices, USB devices, SD cards, solid state drives (SSDs), and storage class memory, as well as other form-factors. Although NAND has proven a successful technology in fueling the drive to scale down to smaller devices and higher chip densities over the past decade, as technology scaled down past 25 nanometer (nm) memory cell technology, several structural, performance, and reliability problems became evident. Two-terminal memory, such as resistive-switching memory, can alleviate many problems observed by NAND FLASH at or below 25 nm technology. Aspects of the subject disclosure provide for improved endurance and program state reliability for such two-terminal memory, mitigating or avoiding problems associated with variable soak times following a program event.

Figure 11:
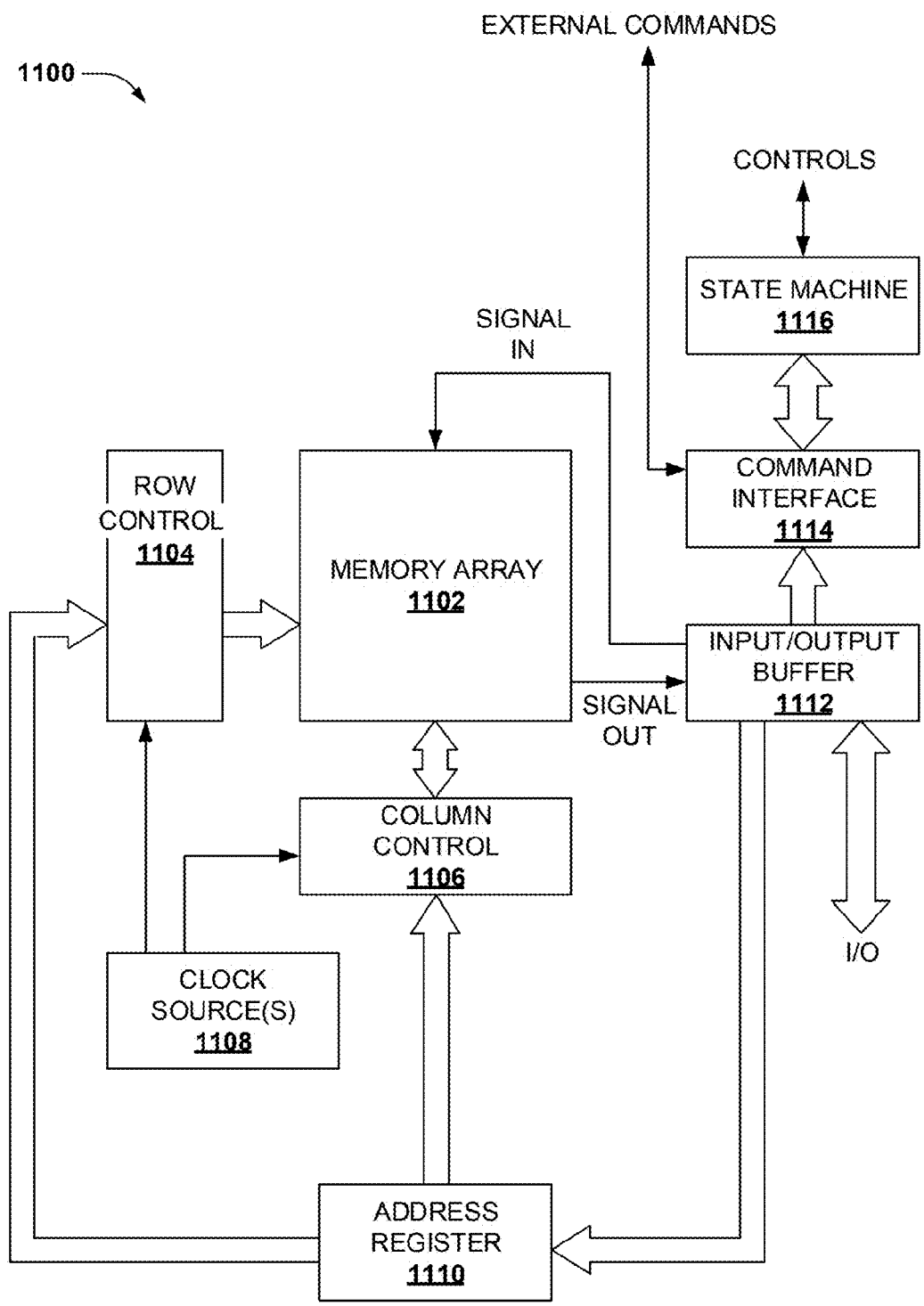
FIG. 11 depicts a block diagram of an example computing environment that can be implemented in conjunction with various embodiments.

In order to provide a context for the various aspects of the disclosed subject matter, FIG. 11, as well as the following discussion, is intended to provide a brief, general description of a suitable environment in which various aspects of the disclosed subject matter can be implemented or processed. While the subject matter has been described above in the general context of two-terminal memory and process methodologies for fabricating or operating such memory, those skilled in the art will recognize that the subject disclosure also can be implemented in combination with other memory cells, arrays of memory cells or process methodologies. Moreover, those skilled in the art will appreciate that the disclosed processes can be practiced with a processing system or a computer processor, either alone or in conjunction with a host computer (e.g., computer 1202 of FIG. 12, infra), which can include single-processor or multiprocessor computer systems, mini-computing devices, mainframe computers, as well as personal computers, hand-held computing devices (e.g., PDA, smart phone, watch), microprocessor-based or programmable consumer or industrial electronics, and the like. The illustrated aspects may also be practiced in distributed computing environments where tasks are performed by remote processing devices that are linked through a communications network. However, some, if not all aspects of the subject innovation can be practiced on stand-alone electronic devices, such as a memory card, Flash memory module, removable memory, or the like. In a distributed computing environment, program modules can be located in both local and remote memory storage modules or devices.

FIG. 11 illustrates a block diagram of an example operating and control environment 1100 for a memory cell array 1102 according to aspects of the subject disclosure. In at least one aspect of the subject disclosure, memory cell array 1102 can comprise a variety of memory cell memory cell technology. Particularly, memory cell array can comprise resistive switching memory cells with pre-conditioning, as described herein.

A column controller 1106 can be formed adjacent to memory cell array 1102. Moreover, column controller 1106 can be electrically coupled with bit lines of memory cell array 1102. Column controller 1106 can control respective bitlines, applying suitable program, erase or read voltages to selected bitlines.

In addition, operating and control environment 1100 can comprise a row controller 1104. Row controller 1104 can be formed adjacent to column controller 1106, and electrically connected with word lines of memory cell array 1102. Row controller 1104 can select particular rows of memory cells with a suitable selection voltage. Moreover, row controller 1104 can facilitate program, erase or read operations by applying suitable voltages at selected word lines.

A clock source(s) 1108 can provide respective clock pulses to facilitate timing for read, write, and program operations of row controller 1104 and column controller 1106. Clock source(s) 1108 can further facilitate selection of word lines or bit lines in response to external or internal commands received by operating and control environment 1100. An input/output buffer 1112 can be connected to an external host apparatus, such as a computer or other processing device (not depicted, but see e.g., computer 1202 of FIG. 12, infra) by way of an I/O buffer or other I/O communication interface. Input/output buffer 1112 can be configured to receive write data, receive an erase instruction, output readout data, and receive address data and command data, as well as address data for respective instructions. Address data can be transferred to row controller 1104 and column controller 1106 by an address register 1110. In addition, input data is transmitted to memory cell array 1102 via signal input lines, and output data is received from memory cell array 1102 via signal output lines. Input data can be received from the host apparatus, and output data can be delivered to the host apparatus via the I/O buffer.

Commands received from the host apparatus can be provided to a command interface 1114. Command interface 1114 can be configured to receive external control signals from the host apparatus, and determine whether data input to the input/output buffer 1112 is write data, a command, or an address. Input commands can be transferred to a state machine 1116.

State machine 1116 can be configured to manage programming and reprogramming of memory cell array 1102. State machine 1116 receives commands from the host apparatus via input/output buffer 1112 and command interface 1114, and manages read, write, erase, data input, data output, and similar functionality associated with memory cell array 1102. In some aspects, state machine 1116 can send and receive acknowledgments and negative acknowledgments regarding successful receipt or execution of various commands.

To implement read, write, erase, input, output, etc., functionality, state machine 1116 can control clock source(s) 1108. Control of clock source(s) 1108 can cause output pulses configured to facilitate row controller 1104 and column controller 1106 implementing the particular functionality. Output pulses can be transferred to selected bit lines by column controller 1106, for instance, or word lines by row controller 1104, for instance.

In connection with FIG. 12, the systems and processes described below can be embodied within hardware, such as a single integrated circuit (IC) chip, multiple ICs, an application specific integrated circuit (ASIC), or the like. Further, the order in which some or all of the process blocks appear in each process should not be deemed limiting. Rather, it should be understood that some of the process blocks can be executed in a variety of orders, not all of which may be explicitly illustrated herein.

Figure 12:
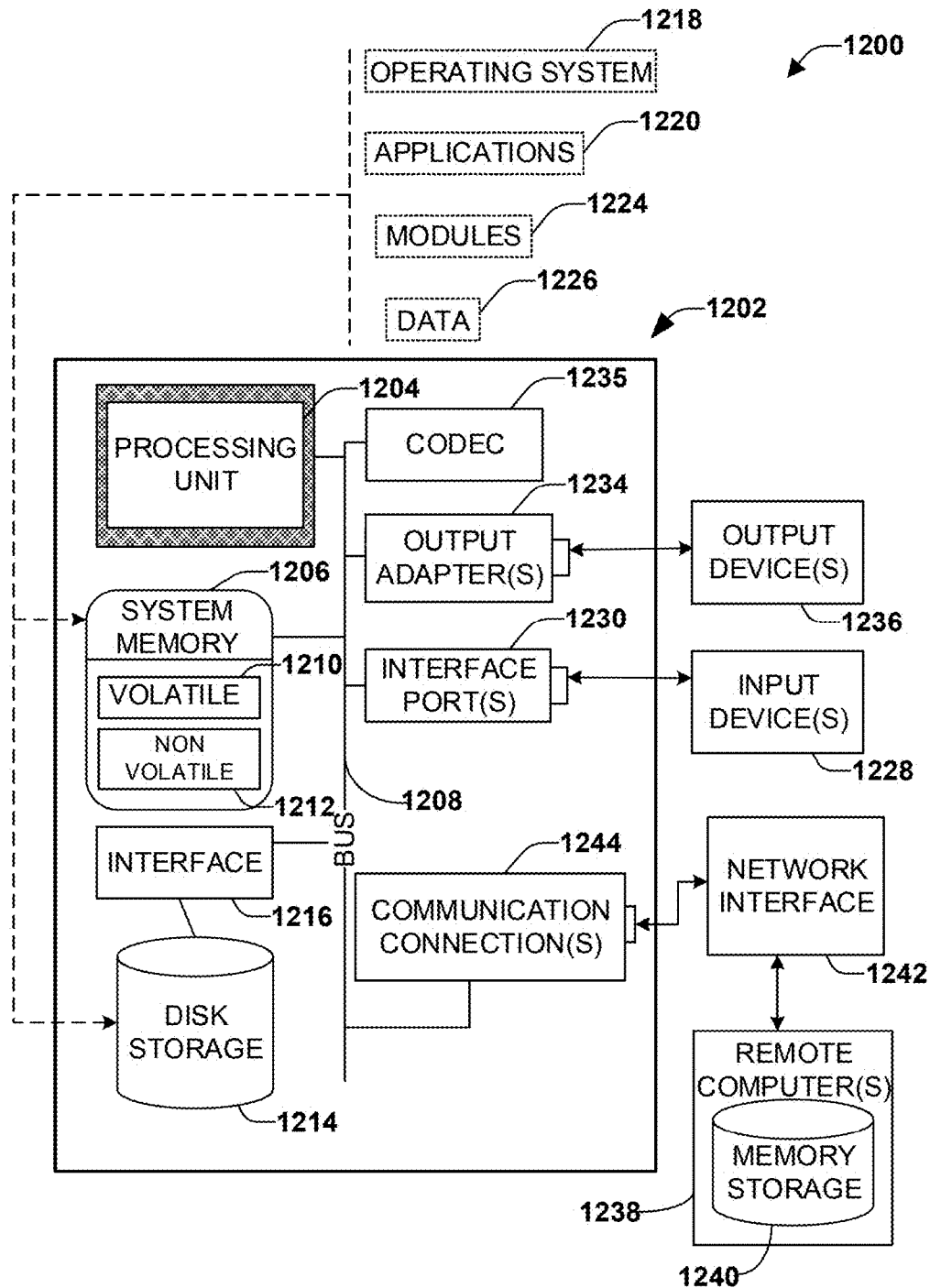
FIG. 12 depicts a suitable operating environment according to an embodiment.

With reference to FIG. 12, a suitable operating environment 1200 for implementing various aspects of the claimed subject matter includes a computer 1202. The computer 1202 includes a processing unit 1204, a system memory 1206, a codec 1235, and a system bus 1208. The system bus 1208 couples system components including, but not limited to, the system memory 1206 to the processing unit 1204. The processing unit 1204 can be any of various available processors. Dual microprocessors and other multiprocessor architectures also can be employed as the processing unit 1204.

The system bus 1208 can be any of several types of bus structure(s) including the memory bus or memory controller, a peripheral bus or external bus, and/or a local bus using any variety of available bus architectures including, but not limited to, Industrial Standard Architecture (ISA), Micro-Channel Architecture (MSA), Extended ISA (EISA), Intelligent Drive Electronics (IDE), VESA Local Bus (VLB), Peripheral Component Interconnect (PCI), Card Bus, Universal Serial Bus (USB), Advanced Graphics Port (AGP), Personal Computer Memory Card International Association bus (PCM-CIA), Firewire (IEEE 1394), and Small Computer Systems Interface (SCSI).

The system memory 1206 includes volatile memory 1210 and non-volatile memory 1212, which can employ one or more of the disclosed memory architectures, memory cells, memory processes, or the like, in various embodiments. The basic input/output system (BIOS), containing the basic routines to transfer information between elements within the computer 1202, such as during start-up, is stored in non-volatile memory 1212. In addition, according to present innovations, codec 1235 may include at least one of an encoder or decoder, wherein the at least one of an encoder or decoder may consist of hardware, software, or a combination of hardware and software. Although, codec 1235 is depicted as a separate component, codec 1235 may be contained within non-volatile memory 1212. By way of illustration, and not limitation, non-volatile memory 1212 can include read only memory (ROM), programmable ROM (PROM), electrically programmable ROM (EPROM), electrically erasable programmable ROM (EEPROM), or Flash memory. Non-volatile memory 1212 can employ one or more of the disclosed memory architectures, in at least some disclosed embodiments. Moreover, non-volatile memory 1212 can be computer memory (e.g., physically integrated with computer 1202 or a mainboard thereof), or removable memory. Examples of suitable removable memory with which disclosed embodiments can be implemented can include a secure digital (SD) card, a compact Flash (CF) card, a universal serial bus (USB) memory stick, or the like. Volatile memory 1210 includes random access memory (RAM), which acts as external cache memory, and can also employ one or more disclosed memory architectures in various embodiments. By way of illustration and not limitation, RAM is available in many forms such as static RAM (SRAM), dynamic RAM (DRAM), synchronous DRAM (SDRAM), double data rate SDRAM (DDR SDRAM), and enhanced SDRAM (ESDRAM), and so forth.

Computer 1202 may also include removable/non-removable, volatile/non-volatile computer storage medium. FIG. 12 illustrates, for example, disk storage 1214. Disk storage 1214 includes, but is not limited to, devices such as a magnetic disk drive, solid state disk (SSD) floppy disk drive, tape drive, Jaz drive, Zip drive, LS-100 drive, flash memory card, or memory stick. In addition, disk storage 1214 can include storage medium separately or in combination with other storage medium including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage 1214 to the system bus 1208, a removable or non-removable interface is typically used, such as interface 1216. It is appreciated that disk storage 1214 can store information related to a user. Such information might be stored at or provided to a server or to an application running on a user device. In one embodiment, the user can be notified (e.g., by way of output device(s) 1236) of the types of information that are stored to disk storage 1214 and/or transmitted to the server or application. The user can be provided the opportunity to opt-in or opt-out of having such information collected and/or shared with the server or application (e.g., by way of input from input device(s) 1228).

It is to be appreciated that FIG. 12 describes software that acts as an intermediary between users and the basic computer resources described in the suitable operating environment 1200. Such software includes an operating system 1218. Operating system 1218, which can be stored on disk storage 1214, acts to control and allocate resources of the computer 1202. Applications 1220 take advantage of the management of resources by operating system 1218 through program modules 1224, and program data 1226, such as the boot/shutdown transaction table and the like, stored either in system memory 1206 or on disk storage 1214. It is to be appreciated that the claimed subject matter can be implemented with various operating systems or combinations of operating systems.

A user enters commands or information into the computer 1202 through input device(s) 1228. Input devices 1228 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 1204 through the system bus 1208 via interface port(s) 1230. Interface port(s) 1230 include, for example, a serial port, a parallel port, a game port, and a universal serial bus (USB). Output device(s) 1236 use some of the same type of ports as input device(s) 1228. Thus, for example, a USB port may be used to provide input to computer 1202 and to output information from computer 1202 to an output device 1236. Output adapter 1234 is provided to illustrate that there are some output devices, such as monitors, speakers, and printers, among other output devices, which require special adapters. The output adapter 1234 can include, by way of illustration and not limitation, video and sound cards that provide a means of connection between the output device 1236 and the system bus 1208. It should be noted that other devices and/or systems of devices provide both input and output capabilities such as remote computer(s) 1238.

Computer 1202 can operate in a networked environment using logical connections to one or more remote computers, such as remote computer(s) 1238. The remote computer(s) 1238 can be a personal computer, a server, a router, a network PC, a workstation, a microprocessor based appliance, a peer device, a smart phone, a tablet, or other network node, and typically includes many of the elements described relative to computer 1202. For purposes of brevity, only a memory storage device 1240 is illustrated with remote computer(s) 1238. Remote computer(s) 1238 is logically connected to computer 1202 through a network interface 1242 and then connected via communication connection(s) 1244. Network interface 1242 encompasses wire and/or wireless communication networks such as local-area networks (LAN) and wide-area networks (WAN) and cellular networks. LAN technologies include Fiber Distributed Data Interface (FDDI), Copper Distributed Data Interface (CDDI), Ethernet, Token Ring and the like. WAN technologies include, but are not limited to, point-to-point links, circuit switching networks such as Integrated Services Digital Networks (ISDN) and variations thereon, packet switching networks, and Digital Subscriber Lines (DSL).

Communication connection(s) 1244 refers to the hardware/software employed to connect the network interface 1242 to the system bus 1208. While communication connection 1244 is shown for illustrative clarity inside computer 1202, it can also be external to computer 1202. The hardware/software necessary for connection to the network interface 1242 includes, for exemplary purposes only, internal and external technologies such as, modems including regular telephone grade modems, cable modems and DSL modems, ISDN adapters, and wired and wireless Ethernet cards, hubs, and routers.

The illustrated aspects of the disclosure may also be practiced in distributed computing environments where certain tasks are performed by remote processing devices that are linked through a communications network. In a distributed computing environment, program modules or stored information, instructions, or the like can be located in local or remote memory storage devices.

Moreover, it is to be appreciated that various components described herein can include electrical circuit(s) that can include components and circuitry elements of suitable value in order to implement the embodiments of the subject disclosure. Furthermore, it can be appreciated that many of the various components can be implemented on one or more IC chips. For example, in one embodiment, a set of components can be implemented in a single IC chip. In other embodiments, one or more of respective components are fabricated or implemented on separate IC chips.

As utilized herein, terms "component," "system," "architecture" and the like are intended to refer to a computer or electronic-related entity, either hardware, a combination of hardware and software, software (e.g., in execution), or firmware. For example, a component can be one or more transistors, a memory cell, an arrangement of transistors or memory cells, a gate array, a programmable gate array, an application specific integrated circuit, a controller, a processor, a process running on the processor, an object, executable, program or application accessing or interfacing with semiconductor memory, a computer, or the like, or a suitable combination thereof. The component can include erasable programming (e.g., process instructions at least in part stored in erasable memory) or hard programming (e.g., process instructions burned into non-erasable memory at manufacture).

By way of illustration, both a process executed from memory and the processor can be a component. As another example, an architecture can include an arrangement of electronic hardware (e.g., parallel or serial transistors), processing instructions and a processor, which implement the processing instructions in a manner suitable to the arrangement of electronic hardware. In addition, an architecture can include a single component (e.g., a transistor, a gate array, . . . ) or an arrangement of components (e.g., a series or parallel arrangement of transistors, a gate array connected with program circuitry, power leads, electrical ground, input signal lines and output signal lines, and so on). A system can include one or more components as well as one or more architectures. One example system can include a switching block architecture comprising crossed input/output lines and pass gate transistors, as well as power source(s), signal generator(s), communication bus(ses), controllers, I/O interface, address registers, and so on. It is to be appreciated that some overlap in definitions is anticipated, and an architecture or a system can be a stand-alone component, or a component of another architecture, system, etc.

In addition to the foregoing, the disclosed subject matter can be implemented as a method, apparatus, or article of manufacture using typical manufacturing, programming or engineering techniques to produce hardware, firmware, software, or any suitable combination thereof to control an electronic device to implement the disclosed subject matter. The terms "apparatus" and "article of manufacture" where used herein are intended to encompass an electronic device, a semiconductor device, a computer, or a computer program accessible from any computer-readable device, carrier, or media. Computer-readable media can include hardware media, or software media. In addition, the media can include non-transitory media, or transport media. In one example, non-transitory media can include computer readable hardware media. Specific examples of computer readable hardware media can include but are not limited to magnetic storage devices (e.g., hard disk, floppy disk, magnetic strips . . . ), optical disks (e.g., compact disk (CD), digital versatile disk (DVD) . . . ), smart cards, and flash memory devices (e.g., card, stick, key drive . . . ). Computer-readable transport media can include carrier waves, or the like. Of course, those skilled in the art will recognize many modifications can be made to this configuration without departing from the scope or spirit of the disclosed subject matter.

What has been described above includes examples of the subject innovation. It is, of course, not possible to describe every conceivable combination of components or methodologies for purposes of describing the subject innovation, but one of ordinary skill in the art can recognize that many further combinations and permutations of the subject innovation are possible. Accordingly, the disclosed subject matter is intended to embrace all such alterations, modifications and variations that fall within the spirit and scope of the disclosure. Furthermore, to the extent that a term "includes", "including", "has" or "having" and variants thereof is used in either the detailed description or the claims, such term is intended to be inclusive in a manner similar to the term "comprising" as "comprising" is interpreted when employed as a transitional word in a claim.

Moreover, the word "exemplary" is used herein to mean serving as an example, instance, or illustration. Any aspect or design described herein as "exemplary" is not necessarily to be construed as preferred or advantageous over other aspects or designs. Rather, use of the word exemplary is intended to present concepts in a concrete fashion. As used in this application, the term "or" is intended to mean an inclusive "or" rather than an exclusive "or". That is, unless specified otherwise, or clear from context, "X employs A or B" is intended to mean any of the natural inclusive permutations. That is, if X employs A; X employs B; or X employs both A and B, then "X employs A or B" is satisfied under any of the foregoing instances. In addition, the articles "a" and "an" as used in this application and the appended claims should generally be construed to mean "one or more" unless specified otherwise or clear from context to be directed to a singular form.

Additionally, some portions of the detailed description have been presented in terms of algorithms or process operations on data bits within electronic memory. These process descriptions or representations are mechanisms employed by those cognizant in the art to effectively convey the substance of their work to others equally skilled. A process is here, generally, conceived to be a self-consistent sequence of acts leading to a desired result. The acts are those requiring physical manipulations of physical quantities. Typically, though not necessarily, these quantities take the form of electrical and/or magnetic signals capable of being stored, transferred, combined, compared, and/or otherwise manipulated.

It has proven convenient, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities. Unless specifically stated otherwise or apparent from the foregoing discussion, it is appreciated that throughout the disclosed subject matter, discussions utilizing terms such as processing, computing, replicating, mimicking, determining, or transmitting, and the like, refer to the action and processes of processing systems, and/or similar consumer or industrial electronic devices or machines, that manipulate or transform data or signals represented as physical (electrical or electronic) quantities within the circuits, registers or memories of the electronic device(s), into other data or signals similarly represented as physical quantities within the machine or computer system memories or registers or other such information storage, transmission and/or display devices.

In regard to the various functions performed by the above described components, architectures, circuits, processes and the like, the terms (including a reference to a "means") used to describe such components are intended to correspond, unless otherwise indicated, to any component which performs the specified function of the described component (e.g., a functional equivalent), even though not structurally equivalent to the disclosed structure, which performs the function in the herein illustrated exemplary aspects of the embodiments. In addition, while a particular feature may have been disclosed with respect to only one of several implementations, such feature may be combined with one or more other features of the other implementations as may be desired and advantageous for any given or particular application. It will also be recognized that the embodiments include a system as well as a computer-readable medium having computer-executable instructions for performing the acts and/or events of the various processes.

What is claimed is:

1. A method of programming a two-terminal memory cell, comprising:
  applying a forming signal to the two-terminal memory cell, the forming signal having a magnitude configured to cause a state change in the two-terminal memory cell to a program state;
  detecting occurrence of the state change in the two-terminal memory cell; and
  applying a follow-up signal to the two-terminal memory cell in the program state in response to detecting the occurrence of the state change, the follow-up signal having a predetermined minimum pulse width.

2. The method of claim 1, further comprising providing the follow-up signal with a signal characteristic having a different value than a corresponding signal characteristic value of the forming signal.

3. The method of claim 2, further comprising providing the follow-up signal with a different pulse time than a corresponding pulse time of the forming signal.

4. The method of claim 2, further comprising providing the follow-up signal with a different field magnitude than a corresponding field magnitude of the forming signal.

5. The method of claim 1, further comprising providing the follow-up signal with a different current compliance than a corresponding current compliance of the forming signal.

6. The method of claim 1, further comprising initiating the follow-up signal at a predetermined time following completion of the forming signal.

7. The method of claim 1, wherein initiating the follow-up signal further comprises modifying the forming signal to become the follow-up signal in response to detecting the occurrence of the state change.

8. The method of claim 1, wherein initiating the follow-up signal further comprises terminating the forming signal and activating the follow-up signal in response to detecting the occurrence of the state change.

9. The method of claim 1, further comprising limiting a maximum current conducted by the two-terminal memory cell in response to the forming signal or in response to the follow-up signal.

10. The method of claim 9, wherein the maximum current is limited to a range of about 100 nanoAmps to about 300 microAmps.

11. The method of claim 1, further comprising providing the forming signal or the follow-up signal with a voltage in a range of about 0.7 volts and about 6 volts.

12. The method of claim 1, further comprising providing the forming signal or the follow-up signal with a pulse width in a range of about 10 nanoseconds to about 10 microseconds.

13. The method of claim 1, further comprising providing an inverse ratio of pulse width and current compliance for the forming signal or for the follow-up signal.

14. The method of claim 1, wherein the two-terminal memory cell is one of a resistive-switching memory cell, a phase-change memory cell or a magneto-resistive memory cell.

15. An electronic device, comprising:
  a memory configured to store instructions related to operating the electronic device, the memory comprising an array of memory cells including a two-terminal memory cell;
  a processor communicatively connected to the memory and configured to execute the instructions to facilitate implementing operations of the electronic device;
  a memory controller configured to:
    apply a forming signal to the two-terminal memory cell that is configured to cause the two-terminal memory cell to switch to a program state, and
    apply a follow-up signal to the two-terminal memory cell following the two-terminal terminal memory cell switching to the program state, the follow-up signal having a pulse width equal to or greater than 10 nanoseconds; and
  a current compliance circuit configured to limit current conducted at the two-terminal memory cell to a maximum current of about 300 microAmps or less.

16. The electronic device of claim 15, wherein the maximum current is within a range from about 100 nanoAmps to the about 300 microAmps.

17. The electronic device of claim 15, wherein the memory controller is further configured to:
  detect switching of the two-terminal memory cell to the program state; and activate the current compliance circuit to limit current conducted by the two-terminal memory cell during application of the forming signal in response to detecting the switching of the two-terminal memory cell to the program state.

18. The electronic device of claim 15, wherein the memory controller further comprises a terminator circuit configured to limit a voltage of the forming signal to a predetermined maximum voltage, wherein the terminator circuit is further configured to reduce the voltage to the predetermined maximum voltage in response to the memory controller detecting the switching of the two-terminal memory cell to the program state.

19. The electronic device of claim 15, wherein the memory controller is further configured to generate the forming signal to have a set of multiple discrete voltages, respective voltages of the set being applied at respective subsets of a pulse width of the forming signal.

20. The electronic device of claim 15, wherein the memory controller determines the two-terminal memory cell has switched to the program state in response to the current compliance circuit limiting the current conducted at the two-terminal memory cell to the maximum current.

21. The electronic device of claim 20, wherein the memory controller is further configured to apply the follow-up signal in response to the determination that the two-terminal memory cell has switched to the program state.

* * * * *